US012765282B2

(12) United States Patent
Tapily et al.

(10) Patent No.: US 12,765,282 B2
(45) Date of Patent: Oct. 13, 2026

(54) SEMICONDUCTOR PROCESSING USING A TWO-DIMENSIONAL POLYMER

(71) Applicant: Tokyo Electron Limited, Tokyo (JP)

(72) Inventors: Kandabara Tapily, Albany, NY (US); Robert D. Clark, Leuven (BE); Gerrit Leusink, Albany, NY (US); Charlotte Cutler, Albany, NY (US); Jeffrey Smith, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 532 days.

(21) Appl. No.: 18/309,521

(22) Filed: Apr. 28, 2023

(65) Prior Publication Data

US 2024/0363333 A1 Oct. 31, 2024

(51) Int. Cl.

| | |
|---|---|
| ***H10P 14/68*** | (2026.01) |
| ***H10P 14/60*** | (2026.01) |
| ***H10P 50/28*** | (2026.01) |
| ***H10P 70/00*** | (2026.01) |
| ***H10P 72/70*** | (2026.01) |
| ***H10W 74/01*** | (2026.01) |

(52) U.S. Cl.

CPC ........ *H10P 14/683* (2026.01); *H10P 14/6342* (2026.01); *H10P 14/6502* (2026.01); *H10P 70/23* (2026.01); *H10P 72/74* (2026.01); *H10W 74/01* (2026.01); *H10P 50/287* (2026.01)

(58) Field of Classification Search

CPC ........... H01L 21/02118; H01L 21/0206; H01L 21/02282; H01L 21/56

See application file for complete search history.

(56) References Cited

U.S. PATENT DOCUMENTS

| | | | | |
|---|---|---|---|---|
| 12,290,835 | B2 * | 5/2025 | Zandi | B05D 1/185 |
| 2015/0170906 | A1 * | 6/2015 | Redepenning | H10D 62/882 257/29 |
| 2024/0017290 | A1 * | 1/2024 | Zandi | H01L 21/32 |
| 2025/0136759 | A1 * | 5/2025 | Strano | C08G 69/26 |

OTHER PUBLICATIONS

Nadhom, H. et al.; "Area Selective Deposition of Metals from the Electrical Resistivity of the Substrate," The Journal of Physical Chemistry Letters; Apr. 22, 2021; 4 pages.

Mackus, A. et al., "From the Bottom-Up: Toward Area-Selective Atomic Layer Deposition with High Selectivity," Chemistry of Materials, Department of Applied Physics, Eindhoven University of Technology, ACS Publications, Dec. 19, 2018, Eindhoven, The Netherlands, 11 pages.

(Continued)

*Primary Examiner* — Alexander G Ghyka

(74) *Attorney, Agent, or Firm* — Slater Matsil, LLP

(57) ABSTRACT

In certain embodiments, a method of microfabrication includes depositing a 2D polymer material over a substrate surface having a first material and a second material such that the 2D polymer adheres to the first material without adhering to the second material. The method further includes depositing a target material over the second material. The 2D material adhered to the first material inhibits deposition of the target material over the first material. The method further includes removing the 2D polymer material.

15 Claims, 11 Drawing Sheets

(56) References Cited

OTHER PUBLICATIONS

Parsons, G. et al.; "Area-Selective Deposition: Fundamentals, Applications, and Future Outlook," Chemistry of Materials, ACS Publications, May 14, 2020, 34 pages.
Tapily, K. et al.; "Advances and Challenges in Selective Deposition," ASD 19, 4th Area Selective Deposition Workshop, ASD Workshop 2019, Book of Abstracts, Apr. 4 & 5, 2019, Imec, Leuven, Belgium, 32 pages.
Zeng, Y. et al., "Irreversible synthesis of an ultrastrong two-dimensional polymeric material," https://doi.org/10.1038/s41586-021-04296-3, Nature, vol. 602, Feb. 2, 2022, 91 pages.

* cited by examiner

SEMICONDUCTOR PROCESSING USING A TWO-DIMENSIONAL POLYMER

TECHNICAL FIELD

This disclosure relates generally to semiconductor fabrication, and, in particular embodiments, to semiconductor processing using a two-dimensional (2D) polymer.

BACKGROUND

Generally, semiconductor devices, such as integrated circuits (ICs), are fabricated by sequentially depositing and patterning layers of dielectric, conductive, and semiconductor materials over a semiconductor substrate, using photolithography and etching to form structures that operate as circuit components (e.g., transistors, resistors, and capacitors) and as interconnect elements (e.g., conductive lines, contacts, and vias). The semiconductor industry continues to increase the density of electronic components (e.g., transistors, diodes, resistors, capacitors, etc.) by continual reductions in minimum feature size, allowing more components to be integrated into a particular area.

SUMMARY

In certain embodiments, a method of microfabrication includes depositing a 2D polymer material over a substrate surface having a first material and a second material such that the 2D polymer adheres to the first material without adhering to the second material. The method further includes depositing a target material over the second material. The 2D material adhered to the first material inhibits deposition of the target material over the first material. The method further includes removing the 2D polymer material.

In certain embodiments, a method of microfabrication includes receiving a semiconductor wafer having a first surface over which structures are to be formed, and having a second surface opposite the first surface. The method further includes depositing a 2D polymer material over the first surface of the semiconductor wafer, positioning the semiconductor wafer over a substrate holder such that the 2D polymer deposited over the first surface is in contact with the substrate holder, and executing subsequent fabrication over a second surface of the semiconductor wafer.

In certain embodiments, a method of microfabrication includes receiving a semiconductor workpiece that comprises first regions and second regions formed over a semiconductor substrate such that the first regions and second regions are interspersed laterally relative to a surface of the semiconductor substrate. The first regions include a first material, and the second regions include a second material. The method further includes depositing, by spin-on deposition in a first spin-coating module of a track system of an integrated processing system, a 2D polymer material such that the 2D polymer forms a 2D polymer film that is selectively deposited over the surfaces of the first regions relative to surfaces of the second regions. The method further includes depositing, by spin-on deposition in a second spin-coating module of the track system of the integrated processing system, a target material such that the target material is selectively deposited over surfaces of the second regions. The 2D polymer film inhibits deposition of the target material over the surfaces of the first regions. The method further includes removing, using a wet removal process in a removal module of the track system of the integrated processing system, the 2D polymer film.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1A:
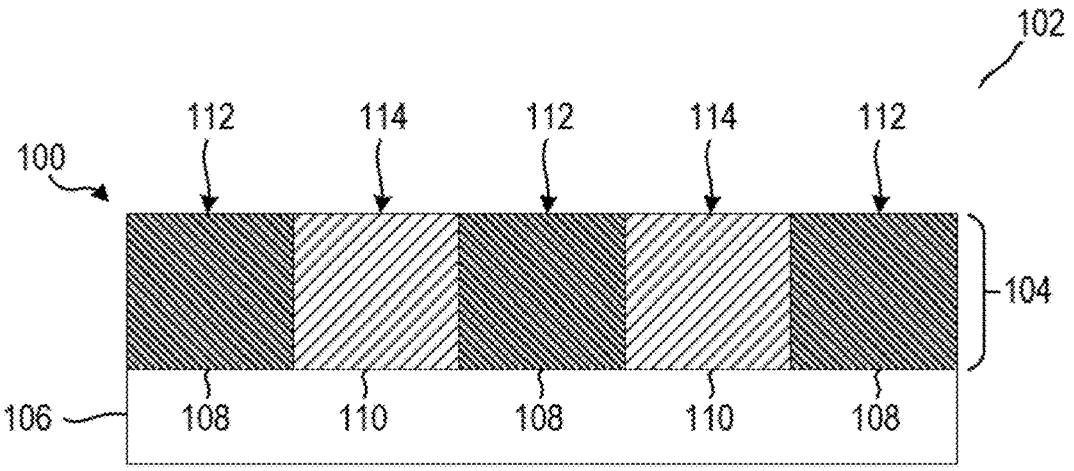
FIGS. 1A-1D illustrate cross-sectional views of an example semiconductor workpiece during various stages of an example process for area selective deposition using a 2D polymer material as an inhibition layer, according to certain embodiments.

A 2D polymer is a monomolecular macromolecule that may include, in certain examples, laterally connected repeat units of monomers with end groups along some or all edges. The laterally connected repeat units may be tessellated such that they form a 2D sheet-like structure. That is, in certain examples, 2D polymers self-assemble into sheets. 2D polymers may be lightweight and extremely strong, including potentially stronger than steel.

Certain embodiments of this disclosure employ a 2D polymer material during semiconductor fabrication processes. For example, certain embodiments use a 2D polymer material as an inhibitor to reduce or eliminate depositing a particular material over an underlying layer. As another example, certain embodiments use a 2D polymer material as a protective layer, such as to provide physical stability to a wafer during semiconductor fabrication and/or a chemical impediment/barrier to a surface of a wafer when the wafer is flipped to perform processing on an opposing side of the wafer.

One example semiconductor fabrication technique is referred to as area selective deposition. Area selective deposition typically refers to a bottom-up approach of selectively depositing a target material over desired surfaces of underlying layers while avoiding depositing the target material over one or more potentially adjacent surfaces. In some cases, using area selective deposition may provide certain advantages.

As described above, some techniques for semiconductor fabrication includes lithography, etch, and deposition steps. These techniques typically involve numerous process steps and are error prone, particularly as features sizes continue to shrink. Additionally, some concerns may include that multiple processes may impact coplanar waveguide (CPW). In certain embodiments, using area selective deposition may reduce or eliminate reliance on some or all instances of lithography, reduce or eliminate reliance on some or all instances of etch processes, reduce or eliminate reliance on some or all instances of chemical mechanical polishes (CMPs), and/or reduce or eliminate limits on scaling.

The semiconductor fabrication industry has increased adoption of area selective deposition due to the ability of area selective deposition to simplify complexity in patterning via self-alignment. As device feature size continues to scale it is becoming a significant challenge to reduce the device contact resistance. As smaller transistors are manufactured, the CD or resolution of patterned features is becoming more challenging to produce.

Due to scaling and cost reduction, simple process schemes for forming semiconductor structures are desired. It may be desirable for self-aligned patterning to replace overlay-driven patterning so that cost-effective scaling can continue even after extreme ultraviolet (EUV) lithography introduction. Selectively depositing thin films may facilitate improved patterning in highly-scaled technology nodes. For implementation of selective deposition in high volume manufacturing, defect and process control step are desired.

Certain conditions may promote successful implementations of area selective deposition. For example, it may be desirable for a wafer to have different surface chemistries in different regions to promote depositing a target material (e.g., growth) in certain regions and not depositing the target material (non-growth) in certain regions. As another example, depending on the implementation of the wafer, in certain scenarios it may be desirable to promote depositing a target material over either a dielectric material (and not over a metal or silicon material) or over a metal (or silicon) material (and not over a dielectric material). As another example, it may be desirable to reduce or eliminate depositing the target substance over the non-deposition (e.g., non-growth) regions, which may facilitate depositing the target materials in the desired regions and not in the undesired regions. As another example, it may be desirable to promote orthogonal film growth of the deposited material, which may help achieve a desired feature profile and maintain critical dimension (CD) integrity.

One of the biggest challenges with area selective deposition is the stability degradation of the blocking layer that is used to inhibit growth of the layer being deposited over certain areas of the wafer, due to deposition chemistries. For example, certain inhibition layers/molecules, such as a self-assembled monolayer inhibition layer, used in area selective deposition may have a blocking limit either temperature, plasma, or chemical.

Area selective deposition techniques may be advantageous for photoresist mask smoothing or other applications, but area selective deposition techniques may present new challenges. Selectivity to different areas may frequently be material dependent, which can limit applicability of area selective deposition techniques. A variety of material modification techniques exist for improved selectivity, such as atomic layer deposition (ALD) and atomic layer etching (ALE) style precursor adhesion and wettability alteration. However, concurrent or separately from any of these effects, improved deposition on tops of features may provide overall improvements to area selective deposition techniques.

Certain embodiments of this disclosure use a 2D polymer as an inhibition layer for area selective deposition. For example, a functionalized 2D polymer may be impermeable as blocking layer for area selective deposition. As a particular example, a semiconductor workpiece may include first regions of a first material and second regions of a second material. A 2D polymer material may be deposited over surfaces of the first regions, while surfaces of the second regions remain free of the 2D polymer, to facilitate depositing the target material over the surfaces of the second regions while the 2D polymer simultaneously blocks or otherwise inhibits depositing the target material over the surfaces of the first regions. In such an example, it may be assumed that the first surfaces are conducive to depositing the 2D polymer and the second surfaces are conducive to repelling the 2D polymer and depositing the target material. In another example, one or more of the first material and/or the second material may be modified to promote receiving or repelling the 2D polymer and/or the target material, as may be appropriate.

FIGS. 1A-1D illustrate cross-sectional views of an example semiconductor workpiece 100 during various stages of an example process 102 for area selective deposition using a 2D polymer material as an inhibition layer, according to certain embodiments. Semiconductor workpiece 100 generically refers to any suitable semiconductor element being processed in accordance with embodiments of this disclosure. Semiconductor workpiece 100 also may be referred to as a wafer or semiconductor wafer, such as a silicon wafer.

As illustrated in FIG. 1A, semiconductor workpiece 100 includes multiple regions 104 formed over a substrate 106.

Substrate 106 may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate 106 is not limited to any particular base structure, underlying layer or overlying layer, patterned or un-patterned, but rather, may include any such layer or base structure, and any combination of layers and/or base structures. Substrate 106 may be a bulk substrate such as a bulk silicon wafer, a silicon-on-insulator (SOI) wafer, or various other semiconductor substrates.

In certain embodiments, substrate 106 may include silicon germanium, silicon carbide, gallium arsenide, gallium nitride, or other compound semiconductors. In certain embodiments, substrate 106 includes heterogeneous layers such as silicon germanium on silicon, gallium nitride on silicon, silicon carbon on silicon, as well layers of silicon on a silicon or SOI substrate. In certain embodiments, substrate 106 is patterned or embedded in other components of a semiconductor device.

Regions 104 may include first regions 108 of a first material and second regions 110 of a second material. The first and second materials may include any suitable combination of a dielectric, a metal, silicon, or any other suitable type of material that may be used in semiconductor fabrication. For example, the first material may be a dielectric and the second material may be metal or silicon, the first material may be metal or silicon and the second material may be a dielectric, both the first and second materials may be dielectrics, or both the first and second materials may be metal or silicon. For example, first regions 108 and second regions 110 may include films of dielectric and/or conductive materials, such as oxide, silicon oxide, silicon nitride, silicon oxynitride, silicon carbide, titanium nitride, tantalum nitride, their alloys, and combinations thereof. In the illustrated example, first regions 108 and second regions 110 are interspersed laterally relative to a surface of substrate 106.

The first material of first regions 108 may have a first selectivity property and the second material of second regions 110 may have a second selectivity property. The first and second selectivity properties may affect the selectivity of depositing a 2D polymer and/or a target material over surfaces 112 of first regions 108 and over surfaces 114 of second regions 110. For example, the first and second selectivity properties may relate to a wettability of surfaces 112 of first regions 108 and over surfaces 114 of second regions 110. As particular examples, the first and second properties could be a suitable combination of hydrophilicity and/or hydrophobicity.

In certain embodiments, it may be desirable for the wettability of the first material and the second material to be different to promote a selectivity of depositing a particular material (e.g., a 2D polymer) over a surface of one region or another. In certain embodiments, a hydrophilic property of a material may promote depositing a 2D polymer over a surface of a region made from that material, while a hydrophobic property of a material may repel or otherwise inhibit depositing a 2D polymer over a surface of region made from that material.

For purposes of the example illustrated in FIGS. 1A-1D, at the state illustrated in FIG. 1A, it will be assumed that the first material of first regions 112 has a first wettability property and the second material of second regions 114 has a different wettability property. For example, it will be assumed that the first material is hydrophilic and the second material is hydrophobic. In certain embodiments, it may be possible to modify the first and/or second property (e.g., to modify a wettability of one or more of the first and second materials) to create a difference in the properties (wettability) of the first and second materials and thereby promote a selectivity of depositing the 2D polymer, for example. Such an example is illustrated and described below in with reference to FIGS. 2A-2E.

Continuing with FIG. 1A, although regions 104 are shown to include first regions 108 and second regions 110, semiconductor workpiece 100 may include additional regions 104, such as additional regions between first regions 108 and second regions 110 and/or between first regions 108 and second regions 110 and substrate 106. Furthermore, although first regions 108 and second regions 110 are shown in an alternating pattern, first regions and second regions 110 may be arranged in different patterns. Regions 104 may include a multilayer stack of films formed over substrate 106, if appropriate. This disclosure contemplates substrate 106 and regions 104 (including first regions 108 and second regions 110) having any suitable thicknesses, and the thickness varying with respect to one another, if appropriate.

Regions 104 may be formed in any suitable manner, including using any suitable combination of wet and/or dry deposition and etch techniques. For example, regions 104 may be deposited using any technique appropriate for the material to be deposited and the semiconductor feature being formed. Suitable deposition processes may include a spin-on coating process, a chemical vapor deposition (CVD) process, an atomic layer deposition (ALD) process, plasma deposition processes (e.g., a plasma-enhanced CVD (PECVD) process or a physical vapor deposition (PVD) process), and/or other layer deposition processes or combinations of processes.

Figure 1B:
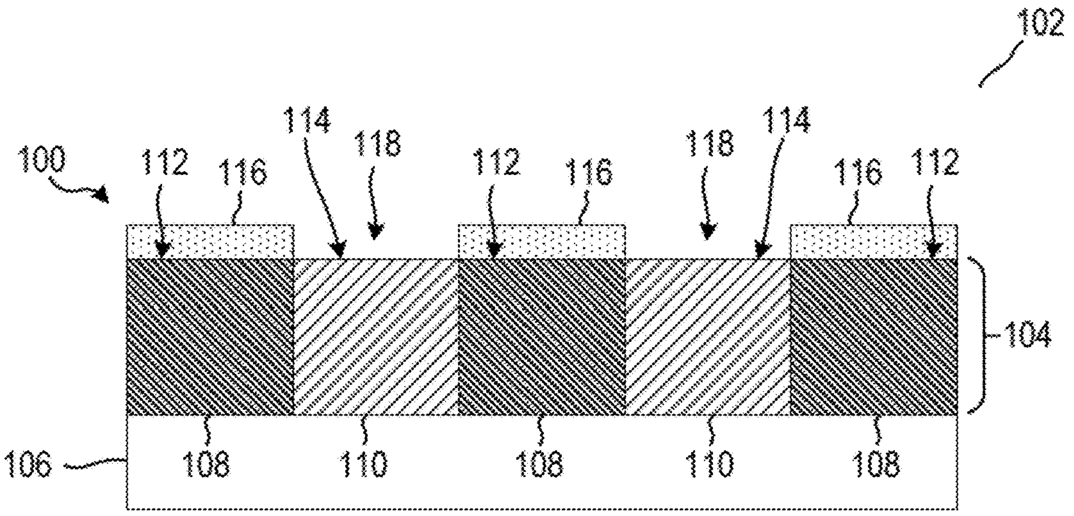

As illustrated in FIG. 1B, a 2D polymer material may be deposited over semiconductor workpiece 100. Due to the variation in the first and second selectivity properties (e.g., wettability) of the first and second materials of the first regions 108 and second regions 110, the 2D polymer material is selectively deposited over surfaces 112 of first regions 108 to form a 2D polymer film 116 over surfaces 112 of first regions 108.

2D polymer film 116 may serve as an inhibition layer during an area selective deposition process, reducing or eliminating deposition over surfaces 112 of first regions 108 of a target material to be deposited over surfaces 114 of second regions 110. In the arrangement illustrated in FIG. 1B, due at least in part to selectively depositing the 2D polymer material over surfaces 112 of first regions 108, recesses 118 may be formed between adjacent portions of 2D polymer film 116. In certain embodiments, surfaces 112 of first regions 108 may be hydrophilic, which may promote depositing the 2D polymer material over surfaces 112 of first regions 108, while surfaces 114 of second regions 110 may be hydrophobic, which may promote repelling of the 2D polymer material over surfaces 114 of second regions 110.

The 2D polymer material of 2D polymer film 116 may be deposited in any suitable manner, including using any suitable combination of wet and/or dry deposition techniques. For example, the 2D polymer material may be deposited using any technique appropriate for the material to be deposited and the semiconductor feature being formed.

In certain embodiments, the 2D polymer material of 2D polymer film 116 is deposited over surfaces 112 of first regions 108 using a spin-on deposition technique, which also may be referred to as spin-coating. With spin-on deposition, a particular material (e.g., the 2D polymer material) is deposited over a substrate (e.g., over surfaces 112 of first regions 108 and surfaces of second regions 110, first and second regions 108/110 formed over substrate 106). The substrate is then rotated (if not already rotating, possibly at a relatively low velocity) at a relatively high velocity so that centrifugal force causes deposited material to move toward edges of the substrate, thereby coating the substrate. Excess material is typically spun off the substrate.

During deposition of the 2D polymer material, due to the selectivity properties of surfaces 112 of first regions and surfaces 114 of second regions 110, the 2D polymer material adheres to surfaces 112 of first regions 108, and then to the 2D polymer material itself as 2D polymer film 116 grows, while little to no 2D polymer material adheres to surfaces 114 of second regions 110, thereby selectively forming 2D polymer formation over surfaces 112 of first regions 108. In certain embodiments, the 2D polymer material may include a polymer and a solvent. The polymer is designed for the 2D polymer film 116, and the solvent may allow the 2D polymer material to be spun to form 2D polymer film 116 over surfaces 112 of first regions 108.

Additionally or alternatively, the 2D polymer material of 2D polymer film 116 may be deposited using any suitable wet or dry process, such as a CVD, PECVD, PVD, ALD, or other suitable process. In certain embodiments, CVD, PECVD, PVD, and ALD processes may be considered examples of vacuum-based deposited processes that may be used to deposit 2D the 2D polymer material of 2D polymer film 116.

In certain embodiments, the 2D polymer material of 2D polymer film 116 may be deposited in a deposition module (e.g., a spin-coating module) of a larger track system for an integrated processing system. An example integrated processing system that includes a track system is described in greater detail below with reference to FIG. 11.

2D polymer film 116 may have any suitable thickness. In certain embodiments, 2D polymer film 116 has a thickness greater than one nanometer, for example greater than two nanometers. It should be understood that these thickness values are provided as examples only, and that 2D polymer film 116 may have any suitable thickness. Furthermore, it will be understood that 2D polymer film 116 may have different thicknesses over different regions of semiconductor workpiece 100. The thickness of 2D polymer film 116 may define the thickness of recesses 118 and, in certain embodiments, may correspond to a desired thickness of a target material to be deposited in recesses 118 over surfaces 114 of second regions 110 at a later stage.

In certain embodiments, as 2D polymer material is being deposited to form 2D polymer film 116, the 2D polymer material grows layer-by-layer, with each layer being connected to each adjacent layer via van der Waals forces. Furthermore, in certain embodiments, it may be desirable maintain the 2D structure of the 2D polymer layers as they grow, which may facilitate alignment of adjacent layers of the 2D polymer and help maintain generally vertical sidewalls of 2D polymer film 116.

In certain embodiments, in addition to inhibiting deposition of the target material of target film 120 over surfaces 112 of first regions 108, the 2D polymer material of 2D polymer film 116 may have other properties, including, for example, an ability to coat over top of first regions 108 with little to no impact over the material of first regions to otherwise serve its purpose, and an ability to be removed during a later processing stage with little to no impact over other aspects of semiconductor workpiece 100.

Figure 1C:
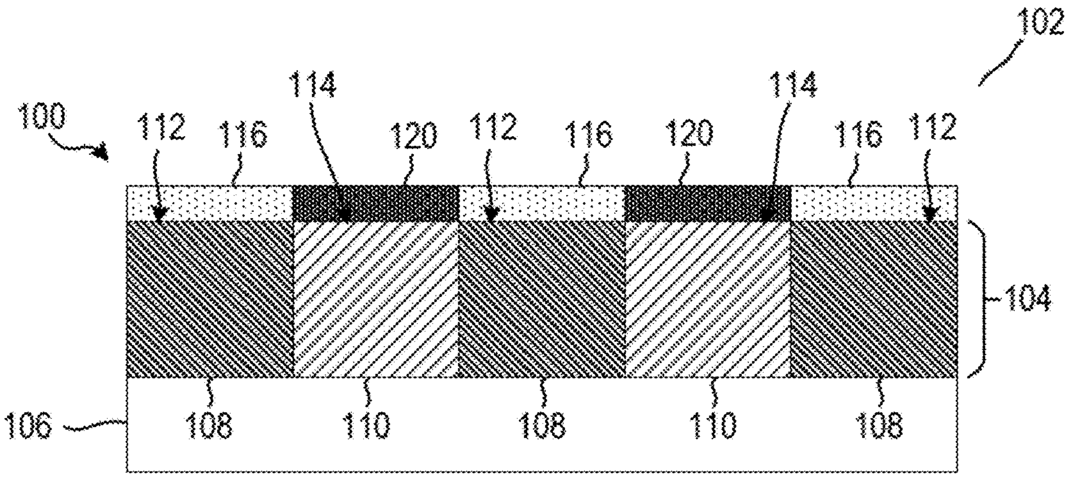

As illustrated in FIG. 1C, a target material may be deposited to form a target film 120 over surfaces 114 of second regions 110. The target material may include any suitable type of material desired to be deposited over surfaces 114 of second regions 110 as part of an area selective deposition process.

While the target material is deposited over surfaces 114 of second regions 110 to form target film 120, 2D polymer film 116 over surfaces 112 of first regions 108 may operate as an inhibition layer to reduce or prevent depositing the target material over surfaces 112 of first regions 108. That is, the target material may be selectively deposited in recesses 118 over surfaces 114 of second regions 110 to form target film 120. 2D polymer film 116 may be designed to prevent penetration from one or more gases or other chemicals associated with depositing the target material of target film 120. In certain embodiments, preventing penetration from one or more gases or other chemicals associated with depositing the target material of target film 120 may include inhibiting such penetration by reducing or eliminating depositing such gases or other chemicals associated with depositing the target material of target film 120 into or over surfaces 112 of first regions 108 while 2D polymer film 116 is present over surfaces 112 of first regions 108.

With certain other types of possible inhibition layers, such as a self-assembled monolayer, various processing steps may be used to attempt to contain deposition of the target film to areas over the intended deposition regions. For example, various etching steps may be performed to reshape a deposited target film to remove portions of the deposited target film that have been deposited in unintended areas. In certain embodiments, using a 2D polymer film as an inhibition layer (e.g., 2D polymer film 116) may reduce or eliminate performing these additional processing steps, as the ability of 2D polymer film 116 reduce or eliminate depositing the target material for forming target film 120 (or other associated substances associated with depositing the target material) may allow 2D polymer film to guide depositing the target material of target film 120 to surfaces 114 of second regions 110 in recesses 118. If desired, prior to depositing the target material, 2D polymer film 116 can be tuned (functionalized) to reduce or eliminate depositing the target material for forming target film 120 (or other associated substances associated with depositing the target material) over 2D polymer film itself, which also may reduce or eliminate performing additional etch steps to reshape target film 120. For example, end groups of 2D polymer film 116 may be functionalized using a fluorinated ligand, with a carbon-based ligand, to repel depositing the target material for target film 120. One or more of these factors may allow depositing the target material of target film 120 to self-align to surfaces 114 of second regions 110 in recesses 118.

Furthermore, the robust nature of the 2D polymer material of 2D polymer film 116 may permit even harsh processes to be used to deposit the target material of target film 120, if desired. Thus, the target material of target film 120 may be deposited in any suitable manner, including using any suitable combination of wet and/or dry deposition and etch techniques. For example, the target material of target film 120 may be deposited using any technique appropriate for the material to be deposited and the semiconductor feature being formed. Suitable deposition processes may include a spin-on coating process, a CVD process, an ALD process, plasma deposition processes (e.g., a PECVD process or PVD process), and/or other layer deposition processes or combinations of processes. For example, the robustness of 2D polymer film 116 as an inhibitor layer may allow certain aggressive chemistries to be used for depositing target film 120, such as metal-containing chemistries (e.g., trimethylaluminum (TMA), silanol, alkoxides, metal halides, organometals, or other suitable metal-containing chemistries), which may be used for certain ALD or other deposition processes, whereas other types of inhibitor films that might be used during an area selective deposition process would be excessively damaged by such an aggressive chemistry.

Target film 120 may have any suitable thickness. In certain embodiments, target film 120 has a thickness that is approximately the same as a thickness of adjacent portions of 2D polymer film 116. It should be understood that these thickness values are provided as examples only, and that target film 120 may have any suitable thickness. Furthermore, it will be understood that target film 120 may have different thicknesses over different regions of semiconductor workpiece 100, if appropriate.

Although functionalizing end groups of 2D polymer film 116 to inhibit depositing target film 120 has been primarily described, in certain embodiments, a 2D polymer film may be deposited over surfaces 114 of second regions 110 and that 2D polymer film may be functionalized to promote deposition of the target material of target film 120, and thereby promote growth of target film 120 over surfaces 114 of second regions 110. This type of functionalized 2D polymer film may be used in combination with or as an alternative to using 2D polymer film 116 as an inhibition layer over surfaces 112 of first regions 108.

Figure 1D:
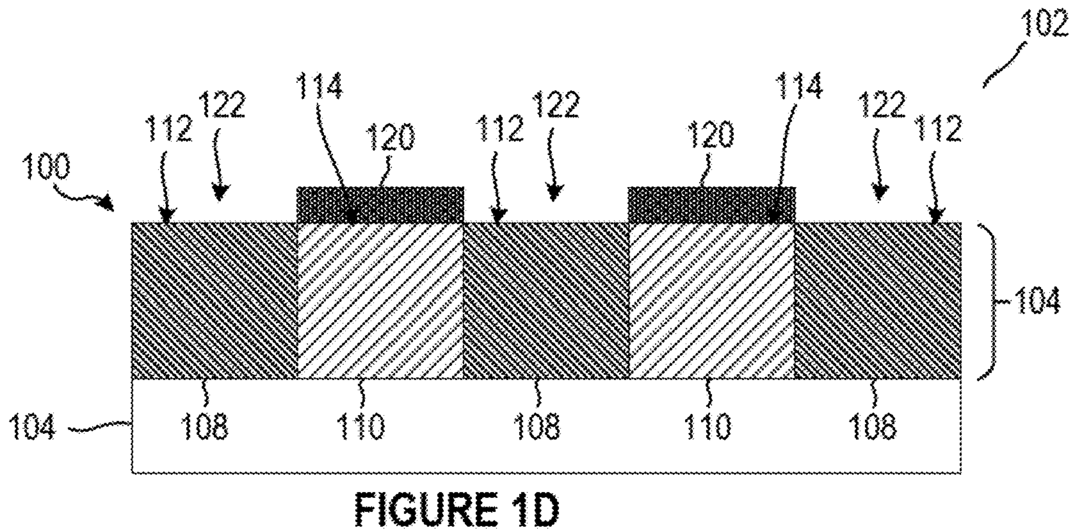
Figure 2A:
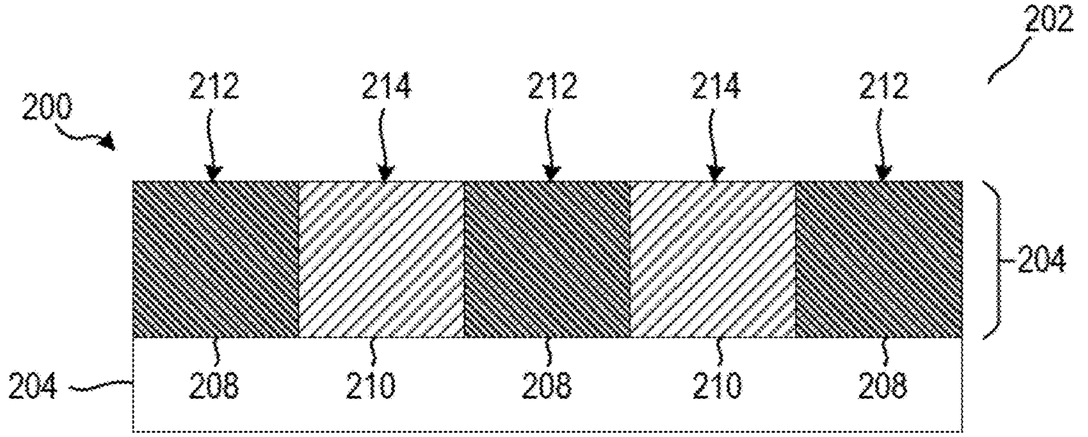
FIGS. 2A-2E illustrate cross-sectional views of an example semiconductor workpiece during various stages of an example process for area selective deposition using a 2D polymer material as an inhibition layer, according to certain embodiments.
Figure 2B:
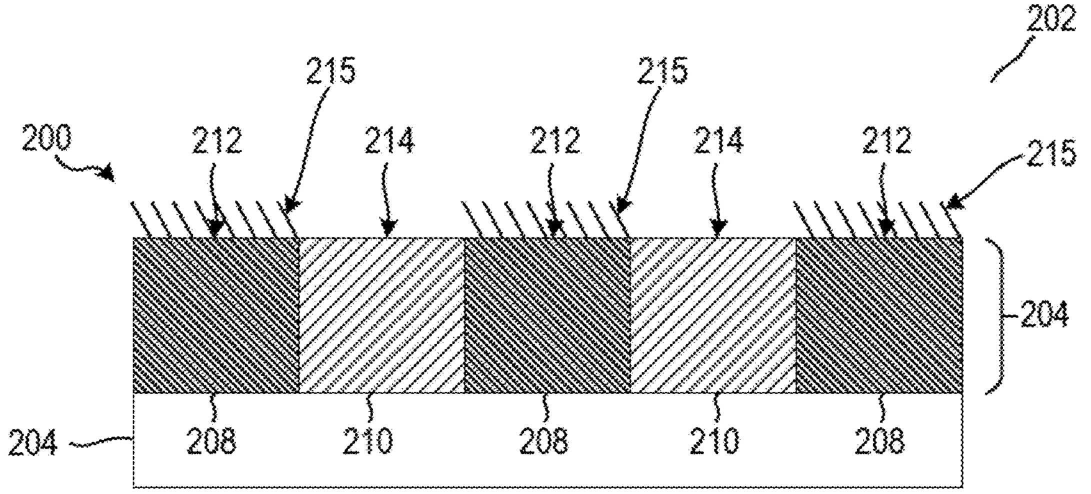
Figure 2C:
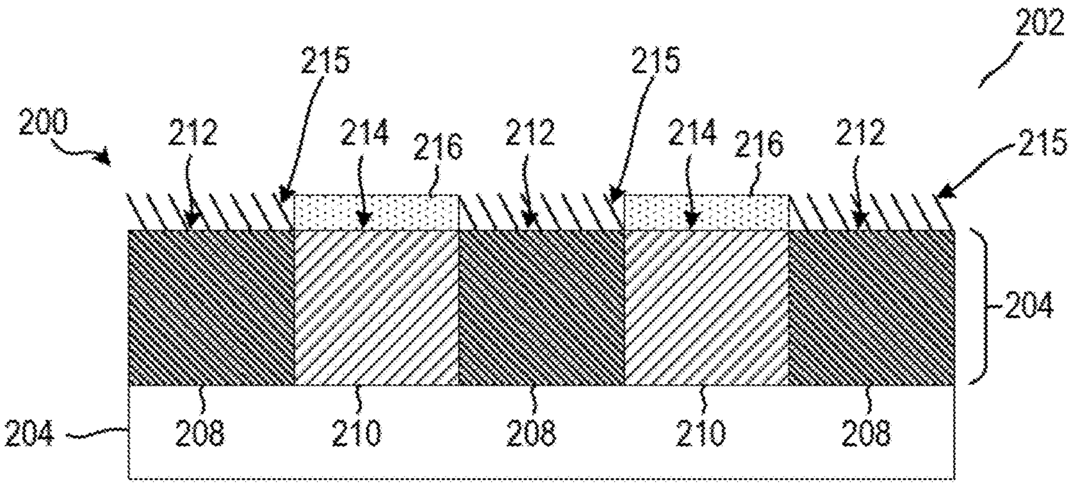
Figure 2D:
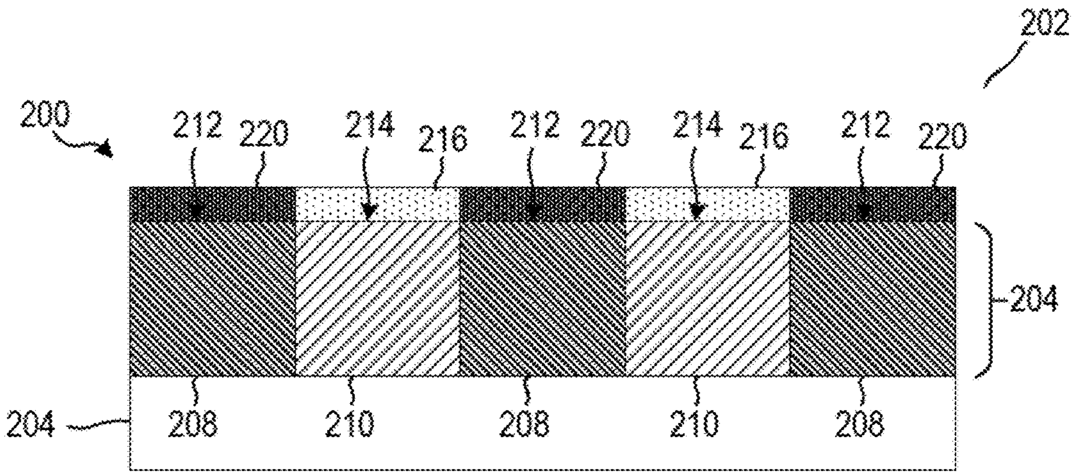

As illustrated in FIG. 1D, 2D polymer film 116 may be removed. For example, the 2D polymer material that forms 2D polymer film 116 may be removed, forming recesses 122 between portions of target film 120.

2D polymer film 116 may be removed in any suitable manner. For example, 2D polymer film 116 may be removed using any suitable dry or wet removal process. An example wet removal process may include the use of strong fluorinated acids such as hydrogen fluoride (HF). As another example, the 2D polymer can be dissolved and cast from a solution of trifluoro acetic acid (TFA) such that, depending on subsequent process steps, the 2D polymer film may be removable in TFA. An example dry removal process may include a plasma with a high content of oxygen-based radical ions. In certain embodiments, 2D polymer film 116 may be removed using a process that is selective to removing the 2D polymer material of 2D polymer film 116 while causing minimal to no removal or other damage to target film 120.

FIGS. 2A-2E illustrate cross-sectional views of an example semiconductor workpiece 200 during various stages of an example process 202 for area selective deposition using a 2D polymer material as an inhibition layer, according to certain embodiments. For brevity and clarity, this description adopts a convention in which elements adhering to the pattern [x02] may be related implementations of a process and/or semiconductor workpiece in certain embodiments. For example, except as otherwise stated or readily apparent, semiconductor workpiece 200 may be similar to semiconductor workpiece 100, process 202 may be similar to process 102, and the like. An analogous convention has also been adopted for other elements as made clear by the use of similar terms in conjunction with the described three-digit numbering system. Through this convention, where applicable, features that have already been described are incorporated by reference without being repeated.

As illustrated in FIG. 2A, semiconductor workpiece 200 includes multiple regions 204 formed over a substrate 206.

In the illustrated example, regions 204 include first regions 208 of a first material and second regions 210 of a second material. In a manner similar to that described with reference to first regions 108 and second regions 110 of FIG. 1A, the first and second materials of first regions 208 and second regions 210, respectively, may include any suitable combination of a dielectric, a metal, silicon, or any other suitable type of material.

For the example process 202 of FIGS. 2A-2E, it will be assumed that a 2D polymer material is to be deposited over surfaces 214 of second regions 210, and a target material is to be deposited over surfaces 212 of first regions 208. Additionally, it will be assumed that, in the state illustrated in FIG. 2A, both surfaces 212 of first regions 208 and surfaces 214 of second regions 210 have a selectivity property of being compatible with deposition of the 2D polymer material. This could be, for example, because first regions 208 and second regions 210 are a similar type of material (e.g., both dielectric materials, both metal materials, both silicon, or both another type of material) or for any other suitable reason. As a particular example, both surfaces 212 of first regions 208 and surfaces 214 of second regions 210 may be hydrophilic, which may be a selectivity property that is compatible with deposition of the 2D polymer material. Thus, to promote selectively depositing the 2D polymer material over surfaces 214 of second regions 210, it may be appropriate to modify a selectivity property of surfaces 212 of first regions 208.

As illustrated in FIG. 2B, a selectivity property (e.g., a wettability) of surfaces 212 of first regions 208 may be modified to reduce compatibility with deposition of a 2D polymer material. For example, surfaces 212 of first regions 208 may be modified to be hydrophobic.

In certain embodiments, a surface modification treatment 215 may be applied to surfaces 212 of first regions 208 to modify the selectivity property of surfaces 212. For example, surface modification treatment 215 may be a suitable self-assembled monolayer or other inhibitor that may be applied to surfaces 212 of first regions to modify the selectivity property of surfaces 212, such as to make surfaces 212 hydrophobic. Application of the surface modification treatment 215 may create a difference in the properties (wettability) of the surfaces 212 of first regions 208 and surfaces 214 of second regions 210, thereby promoting a selectivity of depositing the 2D polymer over surfaces 214 of second regions 210, for example.

In certain embodiments, surface modification treatment 215 may be applied to make selected surfaces of a wafer hydrophilic to thereby promote depositing the 2D polymer material of 2D polymer film 216 over those surfaces. For example, surface modification treatment 215 may be a self-assembled monolayer of poly-4-vinylphenol (PVP), polyvinyl alcohol (PVA), poly(ethylene glycol) (PEG), or another suitable substance. If appropriate, the material of these self-assembled monolayers may be cross-linked. The particular surface modification treatment 215 that is appropriate for a given implementation may depend on one or more of the 2D polymer material being deposited, the material at the surfaces of regions 104 over which depositing the 2D polymer material is desired, and/or other suitable factors. Furthermore, although described as a self-assembled monolayer, surface modification treatment could be applied in other forms, if appropriate. Surface modification treatment 215 may be applied using any suitable wet or dry deposition process.

As illustrated in FIG. 2C, a 2D polymer material may be deposited over semiconductor workpiece 200. Due to the variation in the first and second selectivity properties (e.g., wettability) of surfaces 212 of first regions 208 and surfaces 214 of second regions 210, as created by surface modification treatment 215, the 2D polymer material is selectively deposited over surfaces 214 of second regions 210 to form a 2D polymer film 216 over surfaces 214 of first second 210. For example, surface modification treatment 215 may cause surfaces 212 of first regions 208 to be hydrophobic, which may cause surfaces 212 of first regions to repel the 2D polymer material, while surfaces 214 of second regions 210 may be hydrophilic, which may promote depositing the 2D polymer material (and thereby the formation of 2D polymer film 216) over surfaces 214 of second regions 210.

2D polymer film 216 may serve as an inhibition layer during an area selective deposition process, reducing or eliminating deposition over surfaces 214 of second regions 210 of a target material to be deposited over surfaces 212 of first regions 208.

The 2D polymer material of 2D polymer film 216 may be deposited in any suitable manner, including using any suitable combination of wet and/or dry deposition and etch techniques. For example, the 2D polymer material may be deposited using a spin-on deposition technique, a CVD process, a PECVD process, a PVD process, an ALD process, or other suitable process.

In certain embodiments, the 2D polymer material of 2D polymer film 216 may be deposited in a deposition module (e.g., a spin-coating module) of a larger track system for an integrated processing system. An example integrated processing system that includes a track system is described in greater detail below with reference to FIG. 11.

As illustrated in FIG. 2D, a target material may be deposited to form a target film 220 over surfaces 212 of first regions 208. The target material may include any suitable type of material desired to be deposited over surfaces 212 of first regions 208 as part of an area selective deposition process.

While the target material is deposited over surfaces 212 of first regions 208 to form target film 220, 2D polymer film 216 over surfaces 214 of second regions 210 may operate as an inhibition layer to reduce or prevent depositing the target material over surfaces 214 of second regions 210. That is, the target material may be selectively deposited over surfaces 212 of first regions 208 to form target film 220.

The robust nature of the 2D polymer material of 2D polymer film 216 may permit even harsh processes to be used to deposit the target material of target film 220, if desired. Thus, the target material of target film 220 may be deposited in any suitable manner, including using any suitable combination of wet and/or dry deposition and etch techniques. For example, the target material of target film 220 may be deposited using any technique appropriate for the material to be deposited and the semiconductor feature being formed. Suitable deposition processes may include a spin-on coating process, a CVD process, an ALD process, plasma deposition processes (e.g., a PECVD process), a PVD process, and/or other layer deposition processes or combinations of processes. For example, the robustness of 2D polymer film 216 as an inhibitor layer may allow certain aggressive chemistries to be used for depositing target film 220, such as metal-containing chemistries (e.g., TMA silanol, alkoxides, metal halides, organometals, or other suitable metal-containing chemistries), which may be used for certain ALD or other deposition processes, whereas other types of inhibitor films that might be used during an area selective deposition process would be excessively damaged by such an aggressive chemistry.

Target film 220 may have any suitable thickness. In certain embodiments, target film 220 has a thickness that is approximately the same as a thickness of adjacent portions of 2D polymer film 216. It should be understood that these thickness values are provided as examples only, and that target film 220 may have any suitable thickness. Furthermore, it will be understood that target film 220 may have different thicknesses over different regions of semiconductor workpiece 200, if appropriate.

In certain embodiments, surface modification treatment 215 may be removed prior to depositing the target material of target film 220; however, this disclosure contemplates omitting a deliberate removal step for removing surface modification treatment 215 prior to depositing the target material of target film 220, if appropriate. For example, in an embodiment in which surface modification treatment 215 is a self-assembled monolayer, the self-assembled monolayer might degrade sufficiently without executing a separate step to remove the self-assembled monolayer. However, even in such an embodiment, this disclosure contemplates performing a deliberate step to remove the self-assembled monolayer, if desired.

Figure 2E:
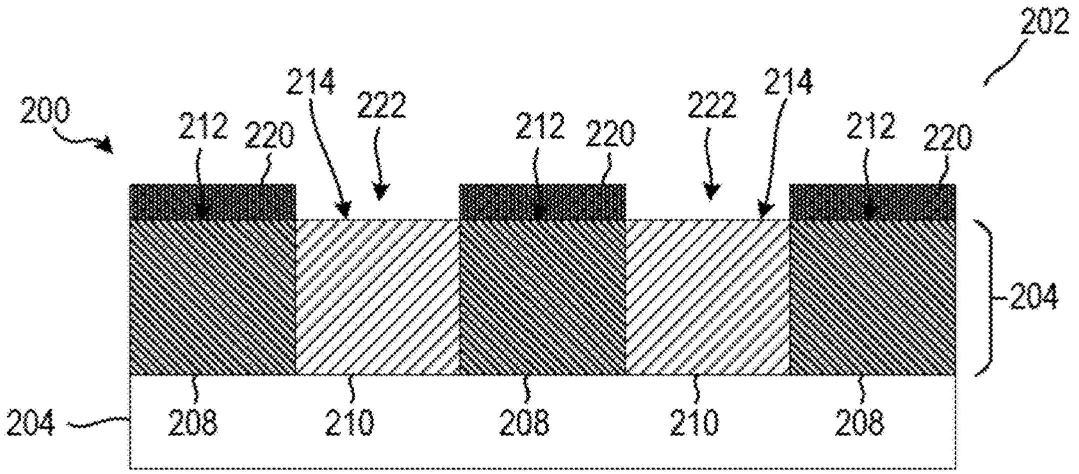

As illustrated in FIG. 2E, 2D polymer film 216 may be removed. For example, the 2D polymer material that forms 2D polymer film 216 may be removed, forming recesses 222 between portions of target film 120.

2D polymer film 216 may be removed in any suitable manner. For example, 2D polymer film 216 may be removed using any suitable dry or wet removal process. In certain embodiments, 2D polymer film 216 may be removed using a process that is selective to removing the 2D polymer material of 2D polymer film 216 while causing minimal to no removal or other damage to target film 220.

In connection with processes 102 and 202, in certain embodiments, one or more of depositing/removing 2D polymer film 116/216, depositing target film 120/220, depositing/removing surface modification treatment 215, and various other processing may be performed in situ, potentially in a vacuum. For example, these processes may be integrated into an integrated processing system (e.g., a track system) for high throughput and potentially vacuum-based implementation.

Figure 3:
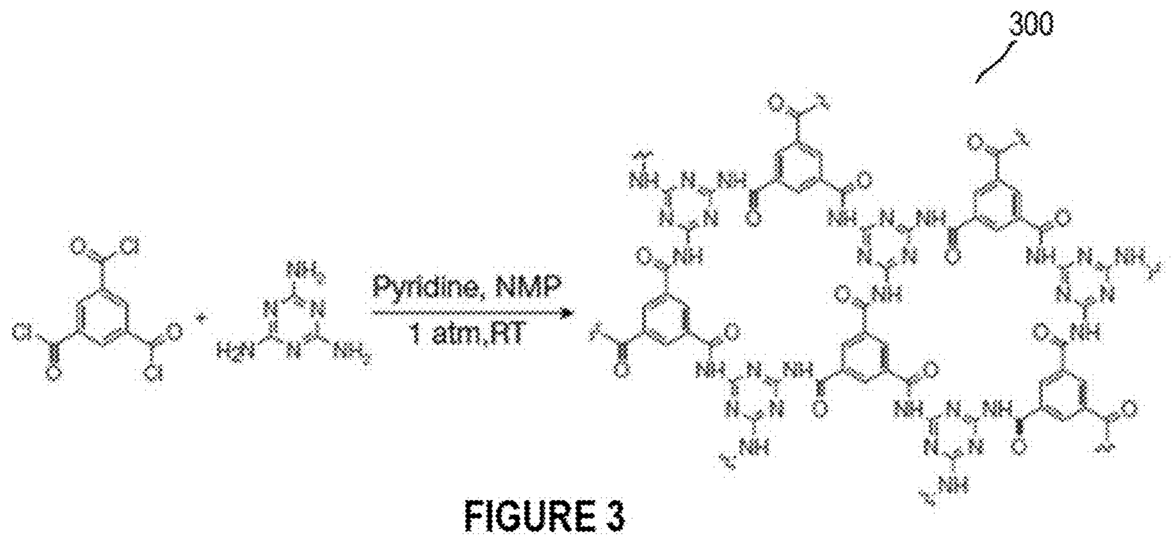
FIG. 3 illustrates an example chemical equation for forming a 2D polymer, according to certain embodiments.
Figure 4:
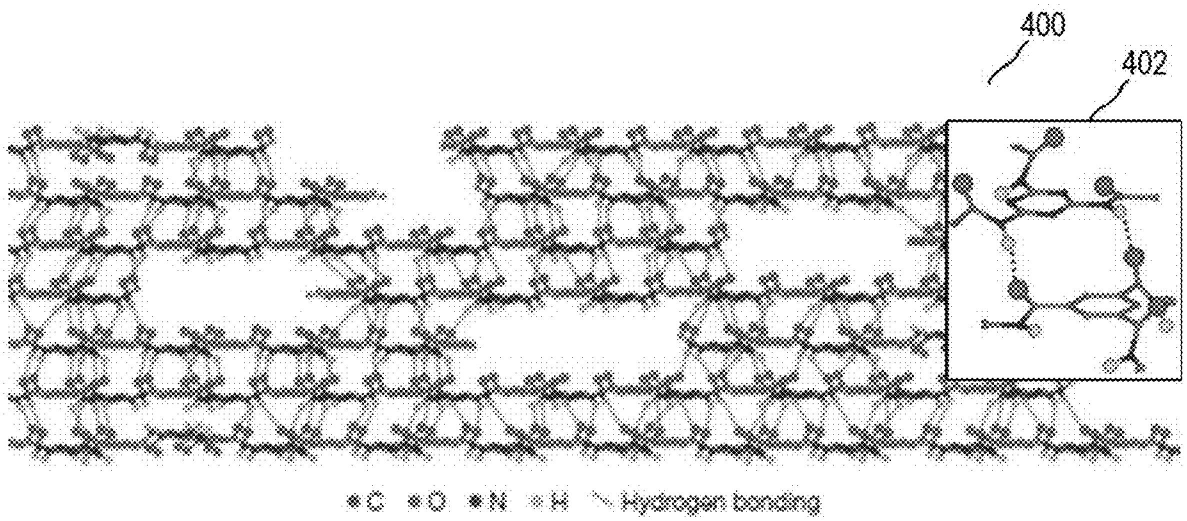
FIG. 4 illustrates an example molecular structure for a 2D polymer, according to certain embodiments.
Figure 5:
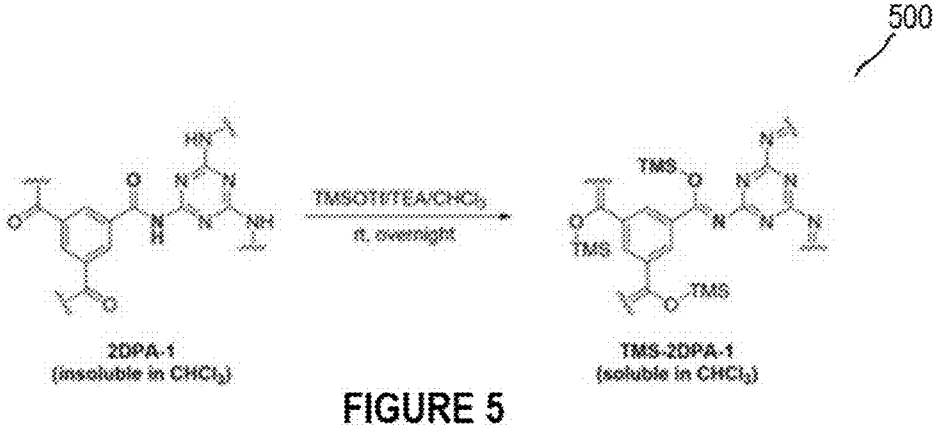
FIG. 5 illustrates an example chemical equation for forming a 2D polymer, according to certain embodiments.

FIGS. 3-5 illustrate example details of example 2D polymers and associated processing, according to certain embodiments. For example, FIGS. 3-5 illustrate example details of a polymerization process and associated product for generating a 2D sheet referred to as a polyaramid. Additional details regarding the example chemical equations and molecular structures shown and described in connection with FIGS. 3-5 can be found in Yuwen Zeng, et al., *Irreversible Synthesis of an Ultrastrong Two-Dimensional Polymeric Material*, in NATURE, vol. 602, issue 7895, 3 Feb. 2022, at p. 91. It should be understood that the chemical equations and molecular structures shown and described in connection with FIGS. 3-5 are provided as examples only, and that this disclosure contemplates using any suitable type of 2D polymer having any suitable molecular structure and generated in any suitable way.

FIG. 3 illustrates an example chemical equation 300 for forming a 2D polymer, according to certain embodiments. For example, chemical equation 300 may represent a synthetic technique for forming a possible 2D polymer material for forming any of the 2D polymer films described in this disclosure, including, for example, previously described 2D polymer films 116 and 216.

For chemical equation 300, the reactants include a C3-symmetric acid chloride and the organic compound melamine (as the monomer building blocks), and the product includes an in-plane bonded polymer, which in this example is a 2D polyaramid. The illustrated reactant conditions include the reaction being performed in the presence of pyridine and N-methyl-2-pyrrolidone (a solution phase) at approximately 1 atmosphere (atm) and at approximately room temperature (RT), that is largely ambient conditions. The resulting structure may include amide linkages and highly hydrogen-bonded N—H stretching. In other words, under at least these conditions, the monomer building blocks (melamine, which includes a ring of carbon and nitrogen atoms) can grow in two dimensions, forming disks that can stack on top of one another and be held together by hydrogen bonds between the layers (so-called van der Waals forces). These bonds can make the resulting structure stable and quite strong.

This process involves a 2D amide condensation of C3-symmetric acid chloride and melamine. In certain embodiments, a strong amide-aromatic conjugation may inhibit out-of-plane rotation, while the interlayer hydrogen bonding or van der Waals attraction may allow growing discs to absorb monomers from the solution and to auto-template them onto 2D surfaces. This may provide a 2D growth pathway. In certain embodiments, the strong aggregation tendency of 2D polyaramid may allow uniform and continuous nanometer-thick films to be generated using spin-coating of a trifluoroacetic acid (TFA) solution onto a substrate. The thickness of a film formed from the 2D polyaramid may be controlled by tuning the solution concentration. Furthermore, in certain embodiments, films of less than 4 nanometers in thickness may be deposited, and the films may be ultraflat, possessing a small apparent root mean square roughness (e.g., approximately 500 μm over 5×5 $\mu m^2$) corresponding to a height variation of four molecular layers or less.

FIG. 4 illustrates an example molecular structure 400 for a 2D polymer, according to certain embodiments. For example, FIG. 4 illustrates a cross-sectional view of an example hydrogen-bonded, interlocked layered structure. Inset 402 provides a magnified view of interlayer hydrogen bonds of molecular structure 400. Molecular structure shows a highly-ordered parallel stacking model.

FIG. 5 illustrates an example chemical equation 500 for forming a 2D polymer, according to certain embodiments. For example, chemical equation 500 illustrates example synthetic technique for a silylation reaction of a 2D polyaramid.

For chemical equation 500, the reactant includes a 2D polyaramid that is insoluble in chloroform ($CHCl_3$), and the product includes silylated version of the 2D polymer (TMS-2D polyaramid) that is soluble in $CHCl_3$. The illustrated reactant conditions include the reaction being performed in the presence of trimethylsilyl triflate (TMSOTf), TEA, and $CHCl_3$) at approximately room temperature (RT) overnight.

Figure 6:
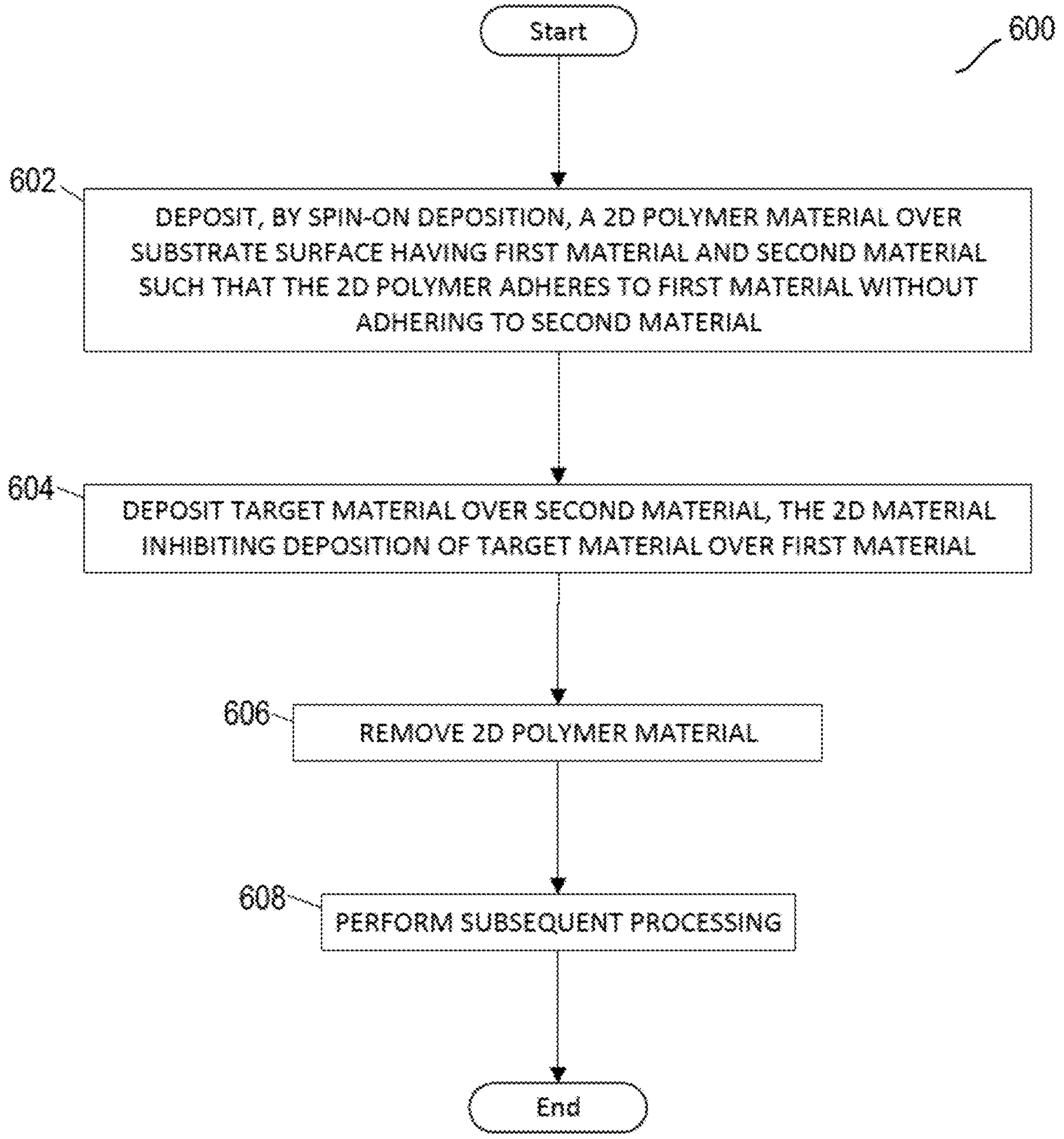
FIG. 6 illustrates an example method for processing a semiconductor workpiece, according to certain embodiments.

FIG. 6 illustrates an example method 600 for processing a semiconductor workpiece, according to certain embodiments. Method 600 may be analogous to portions or all of processes 202 and 302, and for purposes of describing example method 600, reference is made primarily to the reference numerals used in connection with FIGS. 1A-1D. Method 600, however, may implement any suitable patterning process. For example, method 600 may be used to process semiconductor workpiece 100 (e.g., FIGS. 1A-1D), semiconductor workpiece 200 (e.g., FIGS. 2A-2E), or any other suitable type of semiconductor workpiece.

At step 602, a 2D polymer material may be deposited over a substrate surface having a first material and a second material such that the 2D polymer adheres to the first material without adhering to the second material. For example, a semiconductor workpiece 100 may include first regions 108 and second regions 110 formed over a substrate 106. A 2D polymer material may be deposited over surfaces 112 of first regions 108 and surfaces 114 of second regions 110 such that the 2D polymer material adheres to, and forms a 2D polymer film 116 over, surfaces 112 of first regions 108 without adhering to surfaces 114 of second regions 110.

In certain embodiments, the first material is a first metal and the second material is a second metal. For example, first regions 108 may be a first metal and second regions 110 may be a second metal. In certain embodiments, the first material is a first dielectric material and the second material is a second dielectric material. For example, first regions 108 may be a first dielectric material and second regions 110 may be a second dielectric material. In certain embodiments, the first material is a dielectric material and the second material is a metal material. For example, first regions 108 may be a dielectric material and second regions 110 may be a metal. In certain embodiments, the first material is a metal material and the second material is a dielectric material. For example, first regions 108 may be metal and second regions 110 may be a dielectric material.

In certain embodiments, the materials of first regions 108 and second regions 110 may have different selectivity properties, as formed. In certain embodiments, however, it may be appropriate to modify a selectivity property of one or more of first regions 108 and second regions 110 to promote selectively depositing the 2D polymer material over particular surfaces of first regions 108 and second regions 110.

In certain embodiments, the first material is hydrophilic and second material is hydrophobic. For example, surfaces 112 of first regions 108 may be hydrophilic, and surfaces 114 of second regions 110 may be hydrophobic. Assuming that a hydrophilic property promotes adherence of the 2D polymer material and that a hydrophobic property inhibits adherence of the 2D polymer material, the hydrophilic property of surfaces 112 of first regions 108 may promote adherence of the 2D polymer material (and thereby formation of 2D polymer film 116) over surfaces 112 of first regions 108 while the hydrophobic property of surfaces 114 of second regions 110 may inhibit (and potentially completely prevent) adherence of the 2D polymer material (and thereby formation of a 2D polymer film) over surfaces 114 of second regions 110.

In certain embodiments, prior to depositing the 2D polymer, a surface modification treatment may be deposited over the second material, which may modify a selectivity property (e.g., a wettability) of surfaces of the second material. For example, depositing the surface modification treatment (e.g., surface modification treatment 215, described in connection with process 202 of FIGS. 2A-2E) may increase a hydrophobicity of surfaces of the second material to modify the surfaces of the second material to inhibit deposition of the 2D polymer over the surfaces of the second material. In certain embodiments, the surface modification treatment includes a self-assembled monolayer that increases a hydrophobicity of the surfaces of the second material.

Although this disclosure contemplates depositing the 2D polymer material using any suitable deposition technique, in certain embodiments, the 2D polymer material is deposited using a spin-on deposition technique. In certain embodiments, the 2D polymer material is deposited by a vacuum-based deposition process. Although this disclosure contemplates a deposited thickness of the 2D polymer material (e.g., of 2D polymer film 116) being any suitable thickness, in certain embodiments a deposited thickness of the 2D polymer material is greater than one nanometer.

At step 604, a target material may be deposited over the second material, the 2D material adhered to the first material inhibiting deposition of the target material over the first material. For example, with respect to semiconductor workpiece 100, a target material may be deposited over surfaces 114 of second regions 110 to form a target film 120 over surfaces 114 of second regions 110, the 2D polymer of 2D polymer film 116 adhered to surfaces 112 of first regions 108 inhibiting deposition of the target material over surfaces 112 of first regions 108.

In certain embodiments, prior to depositing the target material over surfaces 114 of second regions 110, surfaces 114 of second regions 110 may be cleaned using a suitable material, which given the robustness of 2D polymer film 116 as an inhibitor layer, may include certain aggressive chemistries. For example, prior to depositing the target material over surfaces 114 of second regions 110, surfaces 114 of second regions 110 may be cleaned using one or more metal-containing chemistries, such as one or more of TMA, silanol, alkoxides, metal halides, organometals, or other suitable metal-containing chemistries. In certain embodiments, such chemistries may be used for certain ALD or other deposition processes.

At step 606, the 2D polymer material may be removed. For example, the 2D polymer material may be removed from semiconductor workpiece 100, thereby removing 2D polymer film 116 from semiconductor workpiece 100. In certain embodiments, after 2D polymer film 116 has served its purpose as an inhibition layer during deposition of target film 120, unless otherwise desired to be left over semiconductor workpiece 100, 2D polymer film 116 may be removed from semiconductor workpiece using a suitable removal process.

At step 608, subsequent processing may be performed on semiconductor workpiece 100. Without limiting the subsequent processing that might be performed, the subsequent processing may include, for example, depositing additional material where 2D polymer film 116 was previously located (e.g., over surfaces 112 of first regions 108), using target film 120 as an etch mask for to form features in first regions 108 or for other suitable purposes, or performing any other suitable types of processing. Due at least in part to improved characteristics of target film 120 resulting from use of 2D polymer film 116 as an inhibition layer during the area selective deposition of target film 120 and the associated improved consistency of CD and other aspects of semiconductor workpiece 100, such improvements may persist as additional layers of semiconductor workpiece 100 are processed, if applicable.

Although shown in a logical order, the arrangement and numbering of the steps of method 600 are not intended to be limiting. The steps of method 600 may be performed in any suitable order or concurrently with one another as may be apparent to a person of skill in the art.

Certain embodiments of using a 2D polymer film as an inhibition layer, such as during an area selective deposition process, may provide none, some, or all of the following technical advantages. Other advantages may be described throughout this disclosure or otherwise be apparent from this disclosure to one of skill in the art.

In certain embodiments, a 2D polymer material can be deposited to form a 2D polymer film thicker and with good film thickness control and linear growth relative to other potential inhibition layers, such as self-assembled monolayers. Forming an inhibition layer thicker and with good film thickness control and linear growth may reduce or eliminate mushrooming and lateral growth of the deposited target layer, which may reduce or eliminate defects in devices formed using a 2D polymer layer as an inhibition layer during area selective deposition.

Certain potential inhibition layers that may be used in area selective deposition may have a blocking limit, such as either temperature, plasma, or chemical. In certain embodiments, a 2D polymer film may be impermeable and mechanically strong, and can tolerate aggressive chemistries such as metal-containing chemistries (e.g., TMA, silanol, alkoxides, metal halides, organometals, or other suitable metal-containing chemistries). In certain embodiments, a 2D polymer film can be robust to air exposure.

In certain embodiments, a 2D polymer film is mechanically stronger than steel, potentially up to two times stronger or more and potentially even at a monolayer thickness.

In certain embodiments, the 2D polymer material for the 2D polymer film may be deposited using a spin-on deposition technique, and may be integrated into an integrated processing system (e.g., a track system) for high throughput and potentially vacuum-based implementation.

In certain embodiments, the 2D polymer film can be functionalized such that a surface termination of the 2D polymer film can be tailored to specific ligands to have a targeted selectivity property, such as to be hydrophobic or hydrophilic. For example, surfaces of a 2D polymer film can be functionalized to enable attraction of a desired substance or blocking of a desired substance.

Certain embodiments may implement conditions that promote area selective deposition. For example, depositing a 2D polymer film over certain regions of a wafer (whether as an inhibition layer or as a growth promoter, potentially in combination) may provide different regions of a wafer to have different surface chemistries to promote depositing a target material (e.g., growth) in certain regions and not depositing the target material (non-growth) in certain regions. As another example, the 2D polymer films may be functionalized and/or substrate surfaces may be modified to promote depositing a target material over either a dielectric material (and not over a metal or silicon material) or over a metal (or silicon) material (and not over a dielectric material). As another example, the 2D polymer films may be functionalized and/or substrate surfaces may be modified to reduce or eliminate depositing the target material over the non-deposition (e.g., non-growth) regions, which may facilitate depositing the target materials in the desired regions and not in the undesired regions. As another example, the ability to control the thickness and profile of a 2D polymer film as an inhibition layer may promote orthogonal film growth of the deposited target material, which may help achieve a desired feature profile and maintain CD integrity of a deposited target film.

Potential applications for using a 2D polymer film as an inhibition layer during an area selective deposition process may include fully self-aligned vias (FSAVs), self-aligned gate contacts (SAGCs), area-selective deposition of spacer, and other patterning applications such as dielectric-on-dielectric (silicon nitride (SiN)/silicon dioxide (SiO2)) and so on. In certain embodiments, a 2D polymer film as an inhibition layer during area selective deposition can be used for dielectric-on-dielectric (DoD), dielectric-on-metal (DOM), metal-on-metal (MoM), metal-on-dielectric (MoD) based on pre-treatment and post-treatment (functionalization).

Turning to FIGS. 7A-7D and 8-10, 2D polymers may be used in other aspects of semiconductor fabrication beyond area selective deposition. FIGS. 7A-7D and 8-10 illustrate additional processes that involve potential applications of 2D polymer materials in semiconductor processing, including the use of 2D polymer materials as protection layers. The protection provided by 2D polymer films may include providing physical stability to a semiconductor workpiece and/or to inhibit penetration of one or more chemicals to layers/components for which a 2D polymer film provides a barrier.

In general, the processes illustrated in FIGS. 7A-7D and 8-10 include receiving a semiconductor wafer having a first surface over which structures are to be formed, and having a second surface opposite the first surface; depositing a 2D polymer material over the first surface of the semiconductor wafer; positioning the semiconductor wafer over a substrate holder such that the 2D polymer deposited over the first surface is in contact with the substrate holder; and executing subsequent fabrication on a second surface of the semiconductor wafer. Each of FIGS. 7A-7D and 8-10 are described below.

FIGS. 7A-7D illustrate cross-sectional views of an example semiconductor workpiece 700 during various stages of an example process 702 and using a 2D polymer material as a protection layer, according to certain embodiments. For example, process 702 may incorporate a 2D polymer material as a protection layer during a process for forming a backside power delivery network (BSPDN). Although process 702 is described primarily in relation to form a BSPDN, this disclosure contemplates using a 2D polymer material as a protection layer in any suitable type of heterogeneous integration process, such as backside grinding.

As device feature size continues to scale, designing and fabricating the different routing networks (e.g., power and signal delivery for devices) has become a significant challenge, as incorporating signal and power routing networks on a same side of a device may lead to signal line and power line congestion, IR drop, and/or other problems. This routing challenge may impact future technology even with innovations in device architecture and EUV photolithography techniques.

In some scenarios, using a BSPDN may improve certain routing issues by partially or wholly splitting power delivery between the frontside and backside of a device, which may alleviate routing congestion and/or other problems. For example, structures for routing signals may be formed on a frontside of a device, and structures for routing power delivery signals may be formed on a backside of a device. In this manner, power can be delivered from the backside of a device while signals are delivered from the frontside of the device. Furthermore, freeing up space on the frontside may allow signal lines to be larger, which may reduce the resistivity of the signal lines and increase device speed.

However, implementing BSPDNs also may present certain challenges. For example, a frontside-up approach to BSPDNs may use wafer bonding that would benefit from the frontside of a device being protected while a BSPDN is fabricated. For example, during wafer bonding, the wafer with devices may be flipped to bond to a carrier wafer, and it may be desirable to protect the frontside of the wafer during bonding.

Figure 7A:
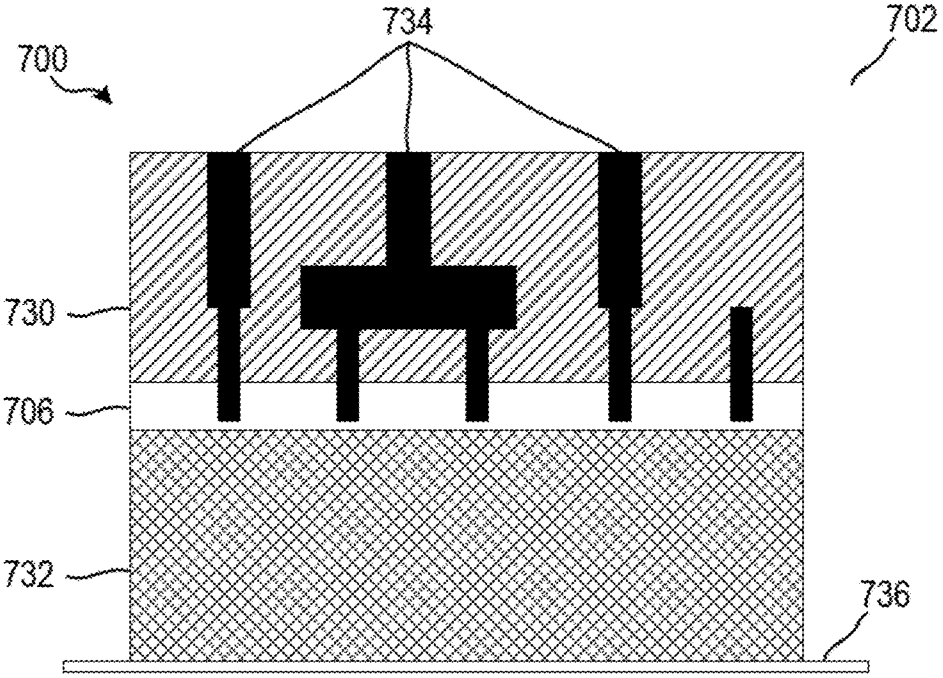
FIGS. 7A-7D illustrate cross-sectional views of an example semiconductor workpiece during various stages of an example process and using a 2D polymer material as a protection layer, according to certain embodiments.

As illustrated in FIG. 7A, semiconductor workpiece 700 includes a frontside 730, and a backside 732 coupled to opposing sides of a substrate 706. Substrate 706 could be, for example, a silicon or other suitable type of substrate.

Frontside 730 may include frontside routing structures 734, which may include a network of structures for delivering signals within a semiconductor device formed from semiconductor workpiece 700. Examples of frontside routing structures 734 may include conductive (e.g., metallization) structures such as conductive vias, interconnects, or other suitable structures. In certain embodiments, frontside 730 includes active devices, such as transistors, diodes, or other suitable semiconductor devices in any suitable combination. Frontside 730 may include a frontside material in which frontside routing structures 734 and active devices are formed.

At the state illustrated in FIG. 7A, backside 732 may include a backside material in which the BSPDN is to be formed at a later stage.

Semiconductor workpiece 700 may be positioned over a substrate holder 736 configured to support semiconductor workpiece 700 during at least a portion of the processing of semiconductor workpiece 700. At the state illustrated in FIG. 7A, semiconductor workpiece 700 is positioned over substrate holder 736 such that backside 732 is between frontside 730 and substrate holder 736, potentially with a surface of backside 732 contacting substrate holder 736.

Figure 7B:
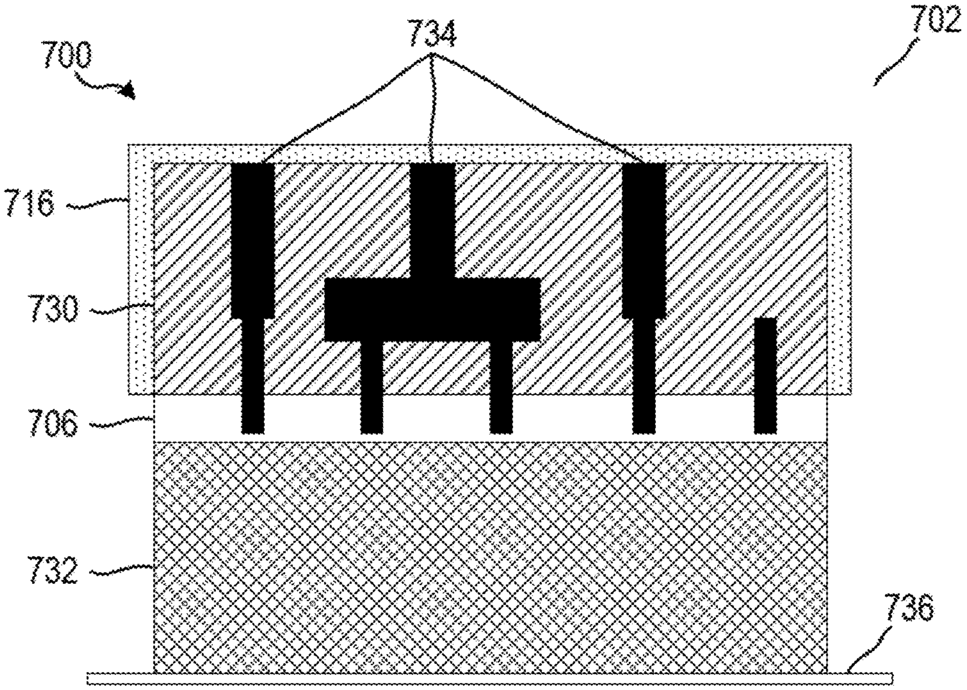

As illustrated in FIG. 7B, a 2D polymer film 716 is deposited over frontside 730. The 2D polymer material of 2D polymer film 716 may be deposited in any suitable manner, including using any suitable combination of wet and/or dry deposition and etch techniques. For example, the 2D polymer material may be deposited using a spin-on deposition technique, a CVD process, a PECVD process, a PVD process, an ALD process, or other suitable process. In certain embodiments, CVD, PECVD, PVD, and ALD processes may be considered examples of vacuum-based deposited processes that may be used to deposit 2D the 2D polymer material of 2D polymer film 716.

2D polymer film 716 may provide certain features due to the robustness of 2D polymer materials. For example, 2D polymer film 716 may provide mechanical support to semiconductor workpiece 700 during processing. As another example, 2D polymer film 716 may provide a barrier to chemicals for frontside 730 during processing of semiconductor workpiece 700.

2D polymer film 716 may have any suitable thickness. In certain embodiments, 2D polymer film 716 is relatively thin and still able to provide mechanical support to semiconductor workpiece 700 and/or a chemical barrier to frontside 730. As an example, 2D polymer film 716 may be as thin as a monolayer. As another example, 2D polymer film may be 5 nanometers or less, such as less than 4 nanometers, 3 nanometers, or 2 nanometers. In certain embodiments, a thickness of 2D polymer film 716 is highly controllable.

Figure 7C:
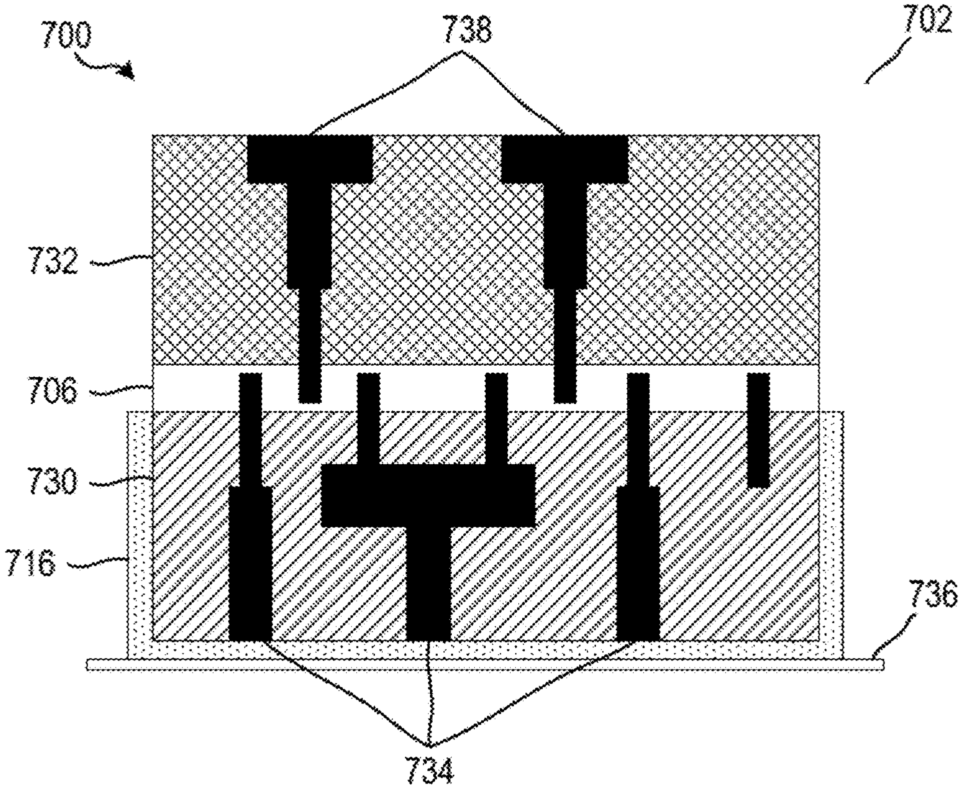

As illustrated in FIG. 7C, semiconductor workpiece 700 may be flipped to perform processing on backside 732, such as to form the BSPDN. For example, semiconductor workpiece 700 may be positioned over substrate holder 736 such that 2D polymer film 716 contacts substrate holder 736. Backside processing may then be performed to form, for example, backside routing structures 738 in the backside material of backside 732.

Backside routing structures 738, which may include a network of structures (e.g., a BSPDN) for delivering power within a semiconductor device formed from semiconductor workpiece 700. Examples of backside routing structures 738 may include conductive (e.g., metallization) structures such as conductive vias, backside power rails, or other suitable structures. Backside processing may include patterning, etching, depositing, and/or other processes for forming backside routing structures 738.

Figure 7D:
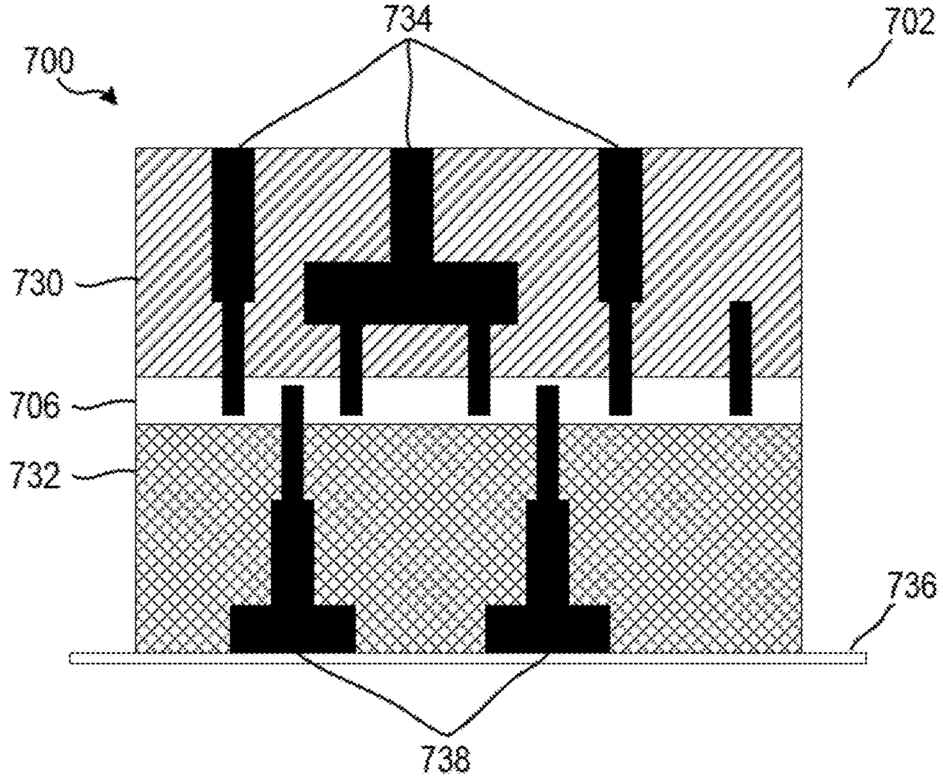

As illustrated in FIG. 7D, semiconductor workpiece 700 again may be flipped to perform processing on frontside 730. For example, semiconductor workpiece 700 may be positioned over substrate holder 736 such that backside 732 is between frontside 730 and substrate holder 736, potentially with backside 732 contacting substrate holder 736. The processing performed on frontside 730 may include, for example, removing 2D polymer film 716 and/or any other suitable processing.

Although process 702 is primarily described using formation of a BSPDN as an example, process 702 may be used in any suitable heterogeneous integration process during which protection of a surface of a semiconductor workpiece may be desired.

Certain embodiments of using a 2D polymer film as a protection layer for a wafer frontside during a process for forming a BSPDN on a wafer backside or in any suitable type of heterogeneous integration process may provide none, some, or all of the following technical advantages. Other advantages may be described throughout this disclosure or otherwise be apparent from this disclosure to one of skill in the art.

In certain embodiments, a 2D polymer film may provide a mechanically robust and impermeable protection layer for the frontside of the semiconductor workpiece. In certain embodiments, a 2D polymer film may be relatively thin, potentially even a monolayer, and still provide one or more of these benefits. Thus, relative to using a thick dielectric cap as a protection layer, using a 2D polymer film may reduce materials consumption and thereby material waste, such as may be associated with a thick dielectric cap and associated planarization (e.g., chemical mechanical polish) and etch processes. In certain embodiments, a 2D polymer film is mechanically stronger than steel, potentially up to two times stronger or more and potentially even at a monolayer thickness.

In certain embodiments, the 2D polymer material for the 2D polymer film may be deposited using a spin-on deposition technique, and may be integrated into an integrated processing system (e.g., a track system) for high throughput and potentially vacuum-based implementation.

Figure 8:
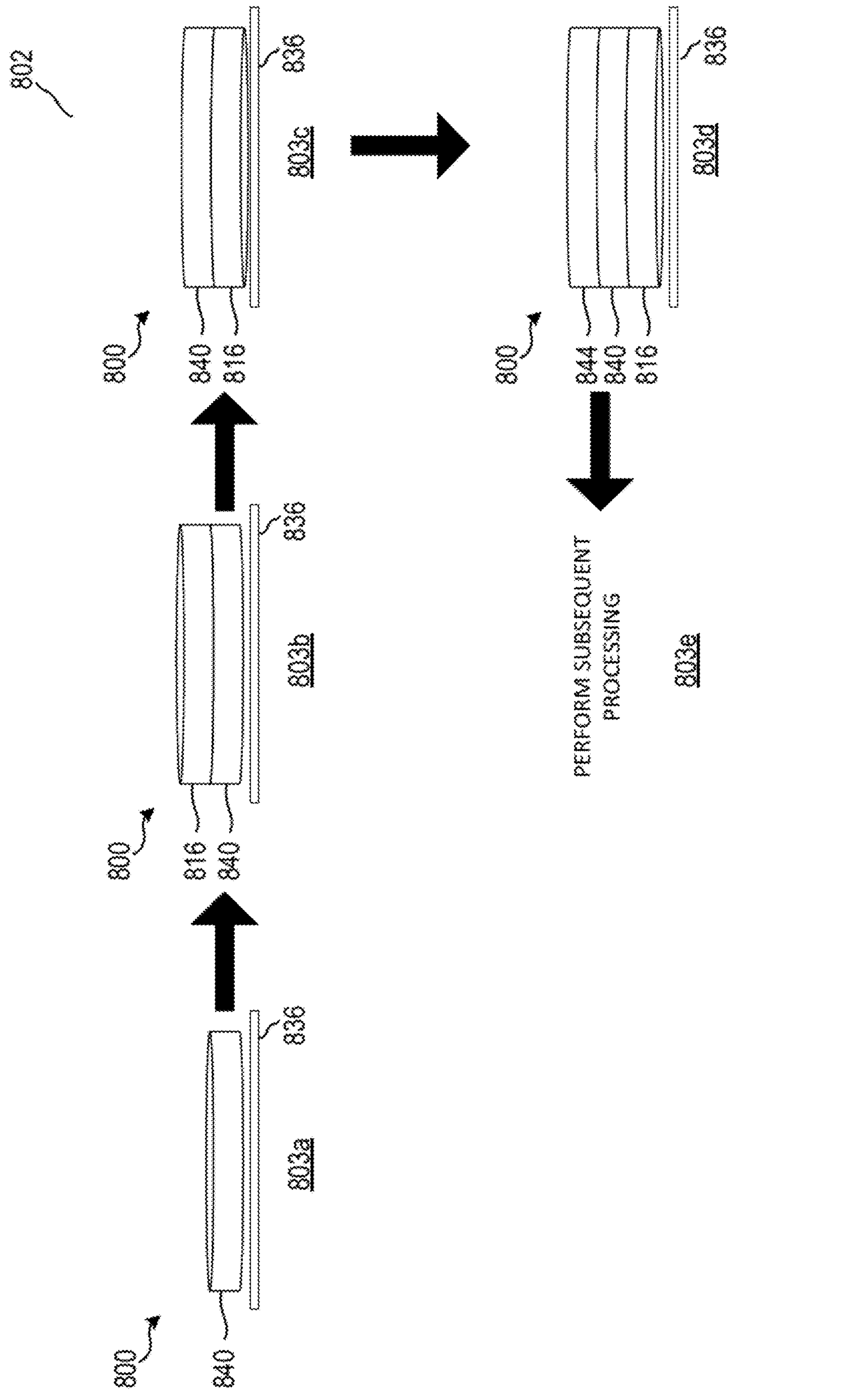
FIG. 8 illustrates example views of a semiconductor workpiece during various stages of an example process and using a 2D polymer material as a protection layer for a wafer frontside, according to certain embodiments.
Figure 9:
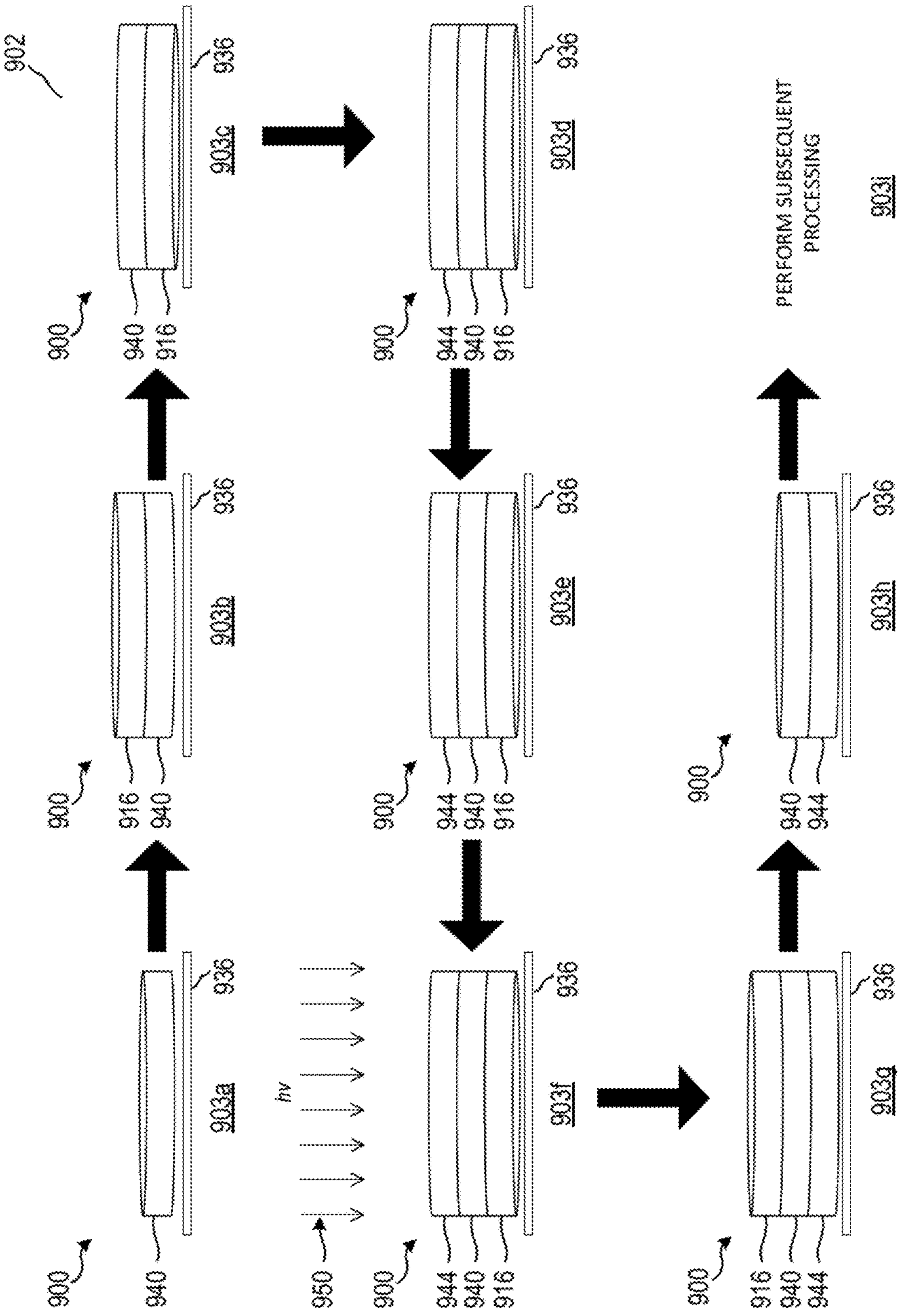
FIG. 9 illustrates example views of a semiconductor workpiece during various stages of an example process and using a 2D polymer material as a protection layer for a wafer frontside, according to certain embodiments.

FIGS. 8 and 9 illustrates example views of semiconductor workpieces 800 and 900, respectively, during various stages of example processes 802 and 902, respectively, and using a 2D polymer material as a protection layer over a wafer frontside, according to certain embodiments. For example, processes 802 and 902 may incorporate a 2D polymer material as a protection layer for a wafer frontside during a process for depositing a film over a wafer backside.

Certain semiconductor fabrication processes include depositing one or more films, such as a stress film, over a wafer backside to attempt to compensate for stress introduced by one or more structures formed over a wafer frontside. In 3D NAND and 3D DRAM device fabrication, for example, a multilayer stack that includes a large number of layers (e.g., >176) may be formed over a wafer frontside and may introduce significant stress on the wafer, potentially leading to undesirable wafer bowing that may negatively impact overlay and edge placement error in both memory and logic applications. Wafer bowing may negatively impact patterning, including for example, the lithography to form deep channels that may be associated with 3D NAND and/or 3D DRAM device fabrication. Depositing a stress film, which also may be referred to as a stress compensating layer, over a backside of a wafer to counter wafer distortion may provide a technique to mitigate the wafer bow impact on overlay.

However, flipping a wafer such that a wafer frontside is positioned over a substrate holder and depositing one or more films over a wafer backside (and/or performing other backside wafer processing) also may present certain challenges. For example, physically manipulating a wafer (e.g., flipping a wafer) may impose additional stress on the wafer, and positioning the wafer such that the wafer frontside contacts the substrate holder may risk damaging the wafer frontside. As another example, using a thick dielectric capping layer as a protective layer for the frontside while depositing a stress film over the backside may introduce yet more stress from the wafer frontside, along with associated wafer bowing. As another example, performing wafer backside processing may expose the wafer frontside to chemicals that could contaminate or otherwise damage the wafer frontside. Thus, it may be desirable to protect the frontside of the wafer in connection with wafer backside processing.

Each of FIGS. 8 and 9 is described below.

FIG. 8 illustrates example views of a semiconductor workpiece 800 during various stages 803 (stages 803*a*-803*e*) of an example process 802 and using a 2D polymer material as a protection layer for a wafer frontside, according to certain embodiments.

As illustrated at stage 803*a*, semiconductor workpiece 800 includes a wafer 840. Wafer 840 is positioned frontside up such that a backside of wafer 840 contacts substrate holder 836. Wafer 840 may include any suitable number of layers and any suitable number of semiconductor structures. As just one example, wafer 840 may include a 3D NAND or 3D DRAM multilayer stack structure formed over a semiconductor substrate, with the substrate being between the multilayer stack structure and substrate holder 836.

As illustrated at stage 803*b*, a 2D polymer film 816 is deposited over the frontside of wafer 840. The 2D polymer material of 2D polymer film 816 may be deposited in any suitable manner, including using any suitable combination of wet and/or dry deposition and etch techniques. For example, the 2D polymer material may be deposited using a spin-on deposition technique, a CVD process, a PECVD process, a PVD process, an ALD process, or other suitable process. In certain embodiments, CVD, PECVD, PVD, and ALD processes may be considered examples of vacuum-based deposited processes that may be used to deposit 2D the 2D polymer material of 2D polymer film 816.

2D polymer film 816 may provide certain features due to the robustness of 2D polymer materials. For example, 2D polymer film 816 may provide mechanical support to semiconductor workpiece 800 (e.g., including wafer 840) during processing. As another example, 2D polymer film 816 may provide a barrier to chemicals for a frontside of wafer 840 during processing of semiconductor workpiece 800.

2D polymer film 816 may have any suitable thickness. In certain embodiments, 2D polymer film 816 is relatively thin and still able to provide mechanical support to semiconductor workpiece 800 (e.g., including wafer 840) and/or a chemical barrier to a frontside of wafer 840. As an example, 2D polymer film 816 may be as thin as a monolayer. As another example, 2D polymer film may be 5 nanometers or less, such as less than 4 nanometers, 3 nanometers, or 2 nanometers. In certain embodiments, a thickness of 2D polymer film 816 is highly controllable.

As illustrated at stage 803*c*, semiconductor workpiece 800 may be flipped to perform processing on a backside of wafer 840, such as to deposit a stress film over the backside of wafer 840. For example, semiconductor workpiece 800 may be positioned over substrate holder 836 such that 2D polymer film 816 contacts substrate holder 836. Backside processing may then be performed to form, for example, a stress film over the backside of wafer 840.

As illustrated at stage 803*d*, a film 844 may be deposited over the backside of wafer 840. In certain embodiments, film 844 may be a stress film designed to compensate for or otherwise counteract a stress and/or wafer bowing introduced through structures and/or processing performed on a frontside of wafer 840. Film 844 may be deposited in any suitable manner, including using any suitable combination of wet and/or dry deposition and etch techniques. For example, film 844 may be deposited using a spin-on deposition technique, a CVD process, a PECVD process, a PVD process, an ALD process, or other suitable process.

As illustrated at stage 803*e*, subsequent processing may be performed on semiconductor workpiece 800. Without limiting the subsequent processing that might be performed, the subsequent processing may include, for example, positioning semiconductor workpiece 800 over substrate holder 836 (e.g., flipped) such that film 844 is between wafer 840 and substrate holder 836 (potentially with film 844 contacting substrate holder 836), removing 2D polymer film 816, and/or performing any other suitable processing on the frontside of wafer 840.

FIG. 9 illustrates example views of a semiconductor workpiece 900 during various stages 903 (stages 903_a_-903_i_) of an example process 902 and using a 2D polymer material as a protection layer for a wafer frontside, according to certain embodiments.

As illustrated at stage 903_a_, semiconductor workpiece 900 includes a wafer 940. Wafer 940 is positioned frontside up such that a backside of wafer 940 contacts substrate holder 936. Wafer 940 may include any suitable number of layers and any suitable number of semiconductor structures. As just one example, wafer 940 may include a 3D NAND or 3D DRAM multilayer stack structure formed over a semiconductor substrate, with the substrate being between the multilayer stack structure and substrate holder 936.

As illustrated at stage 903_b_, a 2D polymer film 916 is deposited over the frontside of wafer 940. The 2D polymer material of 2D polymer film 916 may be deposited in any suitable manner, including using any suitable combination of wet and/or dry deposition and etch techniques. For example, the 2D polymer material may be deposited using a spin-on deposition technique, a CVD process, a PECVD process, a PVD process, an ALD process, or other suitable process. In certain embodiments, CVD, PECVD, PVD, and ALD processes may be considered examples of vacuum-based deposited processes that may be used to deposit 2D the 2D polymer material of 2D polymer film 916.

2D polymer film 916 may provide certain features due to the robustness of 2D polymer materials. For example, 2D polymer film 916 may provide mechanical support to semiconductor workpiece 900 (e.g., including wafer 940) during processing. As another example, 2D polymer film 916 may provide a barrier to chemicals for a frontside of wafer 940 during processing of semiconductor workpiece 900.

2D polymer film 916 may have any suitable thickness. In certain embodiments, 2D polymer film 916 is relatively thin and still able to provide mechanical support to semiconductor workpiece 900 (e.g., including wafer 940) and/or a chemical barrier to a frontside of wafer 940. As an example, 2D polymer film 916 may be as thin as a monolayer. As another example, 2D polymer film may be 5 nanometers or less, such as less than 4 nanometers, 3 nanometers, or 2 nanometers. In certain embodiments, a thickness of 2D polymer film 916 is highly controllable.

As illustrated at stage 903_c_, semiconductor workpiece 900 may be flipped to perform processing on a backside of wafer 940, such as to deposit a stress film over the backside of wafer 940. For example, semiconductor workpiece 900 may be positioned over substrate holder 936 such that 2D polymer film 916 contacts substrate holder 936. Backside processing may then be performed to form, for example, a stress film over the backside of wafer 940.

As illustrated at stage 903_d_, a film 944 may be deposited over the backside of wafer 940. In certain embodiments, film 944 may be a stress film designed to compensate for or otherwise counteract a stress and/or wafer bowing introduced through structures and/or processing performed on a frontside of wafer 940. Film 944 may be deposited in any suitable manner, including using any suitable combination of wet and/or dry deposition and etch techniques. For example, film 944 may be deposited using a spin-on deposition technique, a CVD process, a PECVD process, a PVD process, an ALD process, or other suitable process.

As illustrated at stage 903_e_, film 944 may be patterned according to one or more objectives. For example, film 944 may be patterned for local and/or global wafer bow correction according to the stress and/or wafer bowing introduced through structures and/or processing performed on a frontside of wafer 940.

As illustrated at stage 903_f_, semiconductor workpiece 900 (e.g., film 944) may be exposed to a pattern of actinic radiation 950 and developed to remove portions of film 944 according to the defined pattern. If appropriate, one or more bakes may be performed, such as a post-exposure bake performed prior to development.

As illustrated at stage 903_g_, semiconductor workpiece 900 may be positioned over substrate holder 936 (e.g., flipped) such that film 944 (as patterned) is between wafer 940 and substrate holder 936 (potentially with film 944 contacting substrate holder 936).

As illustrated at stage 903_h_, 2D polymer film 916 may be removed from semiconductor workpiece 900, such as from frontside surface of wafer 940.

As illustrated at stage 903_i_, subsequent processing may be performed on semiconductor workpiece 900. Without limiting the subsequent processing that might be performed, the subsequent processing may include, performing any suitable processing on the frontside of wafer 940.

In connection with process 902, in certain embodiments, depositing 2D polymer film 916 and film 944, the patterning and associated exposure/development of film 944, and removing polymer film 916 may be performed in situ, potentially in a vacuum. For example, these processes may be integrated into an integrated processing system (e.g., a track system) for high throughput and potentially vacuum-based implementation.

Although processes 802 and 902 are primarily described using examples in which film 844/944 is a stress film introduced to compensate for stress and/or wafer bowing introduced by a 3D NAND or 3D DRAM multilayer film stack over a frontside of wafer 840/940, this disclosure contemplates using 2D polymer film 816/916 as a protective film for the frontside of wafer 840/940 in any suitable context in which protection of a frontside of a wafer may be desired.

Certain embodiments of using a 2D polymer film as a protection layer for a wafer frontside may provide none, some, or all of the following technical advantages. Other advantages may be described throughout this disclosure or otherwise be apparent from this disclosure to one of skill in the art.

In certain embodiments, 2D polymer film 816/916 may provide a mechanically robust and impermeable protection layer for the frontside of semiconductor workpiece 800/900. In certain embodiments, 2D polymer film 816/916 may be relatively thin, potentially even a monolayer, and still provide one or more of these benefits. Thus, relative to using a thick dielectric cap as a protection layer, using a 2D polymer film such as 2D polymer film 816/916 may reduce materials consumption and thereby material waste, such as may be associated with a thick dielectric cap and associated planarization (e.g., chemical mechanical polish) and etch processes. In certain embodiments, 2D polymer film 816/916 is mechanically stronger than steel, potentially up to two times stronger or more and potentially even at a monolayer thickness.

In certain embodiments, the 2D polymer material for 2D polymer film 816/916 may be deposited using a spin-on deposition technique, and may be integrated into an integrated processing system (e.g., a track system) for high throughput and potentially vacuum-based implementation.

Figure 10:
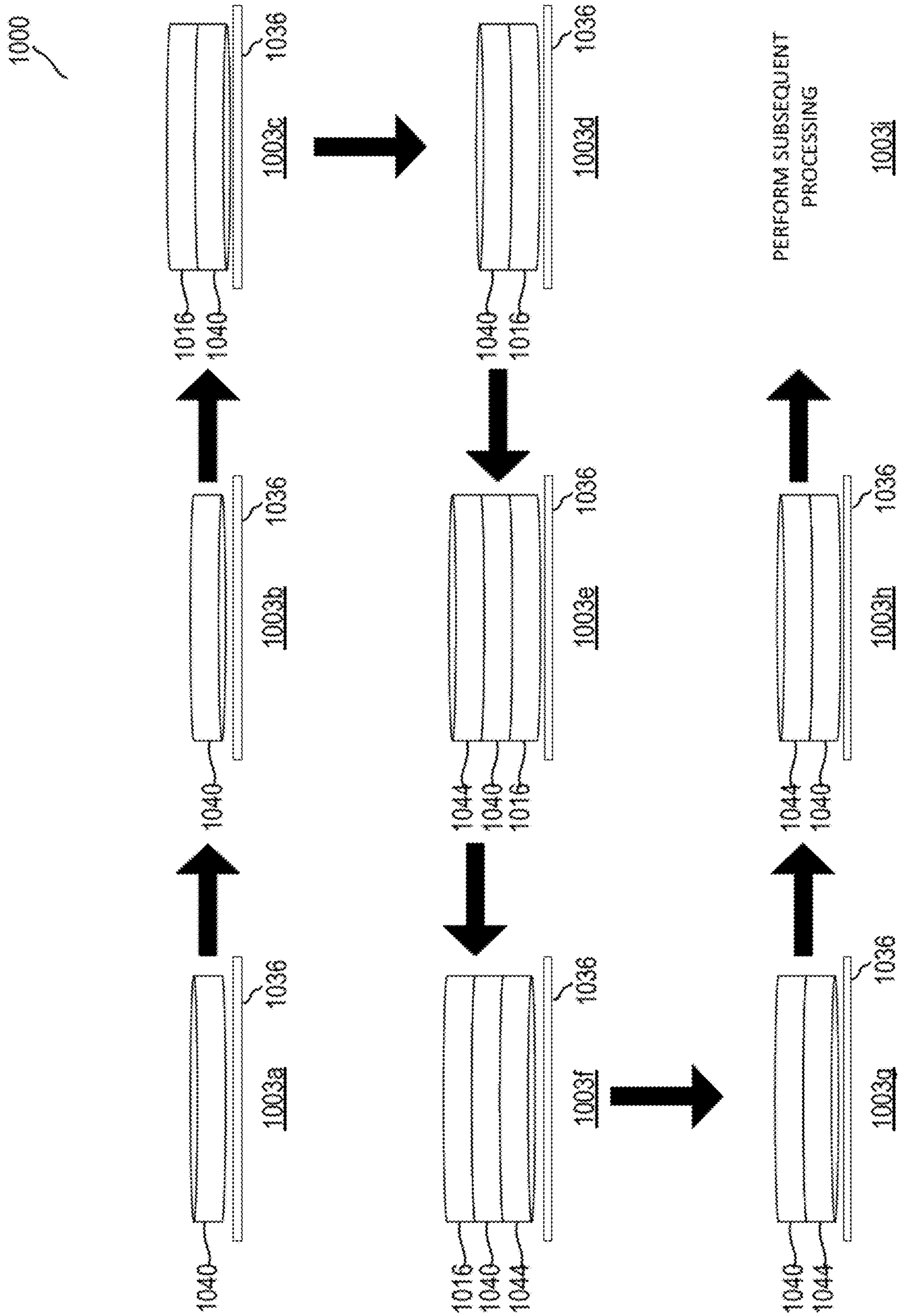
FIG. 10 illustrates example views of a semiconductor workpiece during various stages of an example process and using a 2D polymer material as a protection layer for a wafer backside, according to certain embodiments.

FIG. 10 illustrates example views of a semiconductor workpiece 1000 during various stages 1003 (stages 1003*a*-1003*i*) of an example process 1002 and using a 2D polymer material as a protection layer for a wafer backside, according to certain embodiments. For example, process 1002 may incorporate a 2D polymer material as a protection layer for a wafer backside to reduce or eliminate wafer backside contamination during a process for processing a wafer frontside.

For semiconductor manufacturing, wafer backside contamination control may be important. Some processes (e.g., metal deposition) incorporate backside cleans due to unintended or undesirable backside deposition. For example, some deposition processes, such CVD or ALD processes for depositing metals, may unintentionally or undesirably deposit substances on the backside of wafers. Certain removal processes (e.g., wet removal processes) used to remove these unintentionally or undesirably deposited substances from the backside of wafers may be aggressive and/or not feasible for all materials, potentially damaging the wafer.

As illustrated at stage 1003*a*, semiconductor workpiece 1000 includes a wafer 1040. Wafer 1040 is positioned frontside up such that a backside of wafer 1040 contacts substrate holder 1036. Wafer 1040 may include any suitable number of layers and any suitable number of semiconductor structures. As just one example, wafer 1040 may include certain structures, but metallization layers of the frontside of wafer 1040 have yet to be formed.

As illustrated at stage 1003*b*, semiconductor workpiece 1000 may be flipped to deposit a 2D polymer film over the backside of wafer 1040. For example, semiconductor wafer 1040 may be positioned over substrate holder 1036 such that the frontside of wafer 2D polymer film 916 contacts substrate holder 936.

As illustrated at stage 1003*c*, a 2D polymer film 1016 is deposited over the backside of wafer 1040. The 2D polymer material of 2D polymer film 1016 may be deposited in any suitable manner, including using any suitable combination of wet and/or dry deposition and etch techniques. For example, the 2D polymer material may be deposited using a spin-on deposition technique, a CVD process, a PECVD process, a PVD process, an ALD process, or other suitable process. In certain embodiments, CVD, PECVD, PVD, and ALD processes may be considered examples of vacuum-based deposited processes that may be used to deposit 2D the 2D polymer material of 2D polymer film 1016.

2D polymer film 1016 may provide certain features due to the robustness of 2D polymer materials. For example, 2D polymer film 1016 may provide mechanical support to semiconductor workpiece 1000 (e.g., including wafer 1040) during processing. As another example, 2D polymer film 1016 may provide a barrier to chemicals for a backside of wafer 1040 during processing of semiconductor workpiece 1000, thereby reducing or eliminating contamination of the backside of wafer 1040.

2D polymer film 1016 may have any suitable thickness. In certain embodiments, 2D polymer film 1016 is relatively thin and still able to provide mechanical support to semiconductor workpiece 1000 (e.g., including wafer 1040) and/or a chemical barrier to a backside of wafer 1040. As an example, 2D polymer film 1016 may be as thin as a monolayer. As another example, 2D polymer film may be 5 nanometers or less, such as less than 4 nanometers, 3 nanometers, or 2 nanometers. In certain embodiments, a thickness of 2D polymer film 1016 is highly controllable.

As illustrated at stage 1003*d*, semiconductor workpiece 1000 may be flipped to perform processing on a frontside of wafer 1040. For example, semiconductor workpiece 1000 may be positioned over substrate holder 1036 such that 2D polymer film 1016 contacts substrate holder 1036.

As illustrated at stage 1003*e*, frontside processing of wafer 1040 may be performed. In the illustrated example, the frontside processing is shown as depositing a film 1044 over the frontside of wafer 1040. This disclosure, however, contemplates any suitable processing being performed on the frontside of wafer 1040. For example, one or more metallization layers be formed over or in wafer 1040. The processing performed on the frontside of wafer 1040 may include any suitable types of dry or wet deposition or etching processes, including, for example, spin-coating, a CVD process, a PECVD process, a PVD process, an ALD process, an ALE process, a plasma etch process, or other suitable processes.

As illustrated at stage 1003*f*, semiconductor workpiece 1000 may be positioned over substrate holder 1036 (e.g., flipped) such that film 1044 is between wafer 1040 and substrate holder 1036 (potentially with film 1044 contacting substrate holder 1036).

As illustrated at stage 1003*g*, 2D polymer film 1016 may be removed from semiconductor workpiece 1000, such as from backside surface of wafer 1040.

As illustrated at stage 1003*h*, semiconductor workpiece 1000 may be positioned over substrate holder 1036 (e.g., flipped) such that wafer 1040 is between film 1044 and substrate holder 1036 (potentially with a backside of wafer 1040 contacting substrate holder 1036).

As illustrated at stage 1003*i*, subsequent processing may be performed on semiconductor workpiece 1000. Without limiting the subsequent processing that might be performed, the subsequent processing may include, performing any suitable processing on the frontside of wafer 1040.

In connection with process 1002, in certain embodiments, depositing 2D polymer film 1016 and film 1044 (or other processing of the frontside of wafer 1040), and removing polymer film 1016 may be performed in situ, potentially in a vacuum. For example, these processes may be integrated into an integrated processing system (e.g., a track system) for high throughput and potentially vacuum-based implementation.

This disclosure contemplates using 2D polymer film 1016 as a protective film for the backside of wafer 1040 in any suitable context in which protection of a backside of a wafer may be desired.

Certain embodiments of using a 2D polymer film as a protection layer for a wafer backside may provide none, some, or all of the following technical advantages. Other advantages may be described throughout this disclosure or otherwise be apparent from this disclosure to one of skill in the art.

Certain embodiments may reduce or eliminate reliance on certain cleaning techniques for cleaning the backside of wafers, as due to the presence of the 2D polymer film as a backside protection layer, contamination of backside of the wafer may be reduced or eliminated. This may reduce or eliminate use of such backside cleaning processes, which can be aggressive and not feasible for all materials, potentially damaging structures that are part of a semiconductor workpiece that includes the wafer. Thus, using 2D polymer film as a backside protection layer for a wafer may reduce or eliminate certain damage to structures that are part of a semiconductor workpiece that includes the wafer.

In certain embodiments, 2D polymer film 1016 may provide a mechanically robust and impermeable protection layer for the backside of semiconductor workpiece 1000. In certain embodiments, 2D polymer film 1016 may be relatively thin, potentially even a monolayer, and still provide one or more of these benefits. Thus, relative to using a thick dielectric cap as a protection layer, using a 2D polymer film such as 2D polymer film 1016 may reduce materials consumption and thereby material waste, such as may be associated with a thick dielectric cap and associated planarization (e.g., chemical mechanical polish) and etch processes. In certain embodiments, 2D polymer film 1016 is mechanically stronger than steel, potentially up to two times stronger or more and potentially even at a monolayer thickness.

In certain embodiments, the 2D polymer material for 2D polymer film 1016 may be deposited using a spin-on deposition technique, and may be integrated into an integrated processing system (e.g., a track system) for high throughput and potentially vacuum-based implementation.

It should be understood that any of the processes and uses of 2D polymers described in connection with FIGS. 1A-1D, 2A-2E, 3-5, 6, 7A-7D, 8, 9, and 10 may be combined in any suitable manner, such that a semiconductor/device manufacturing process may benefit from some or all of the potential inhibition and protection applications described herein.

Figure 12:
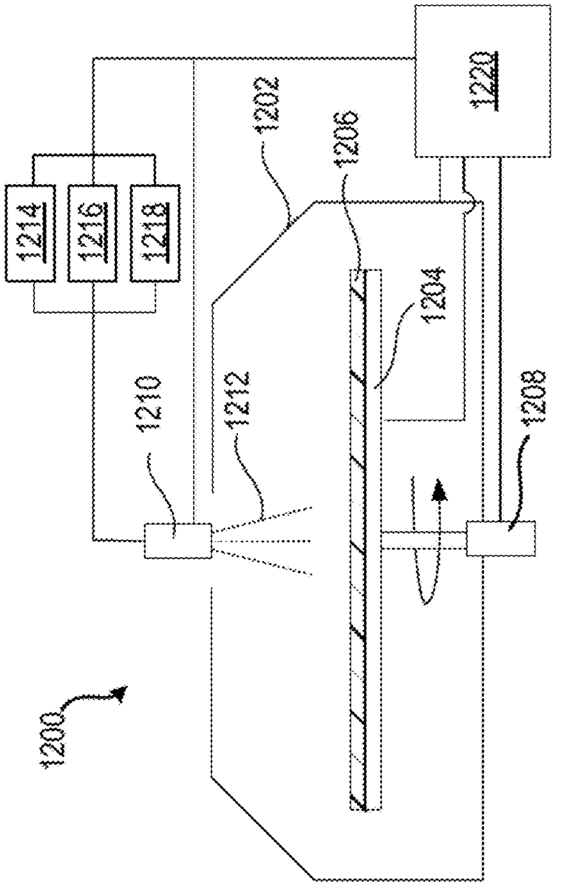
FIG. 12 illustrates an example liquid-based spin-on deposition system, according to certain embodiments.
Figure 11:
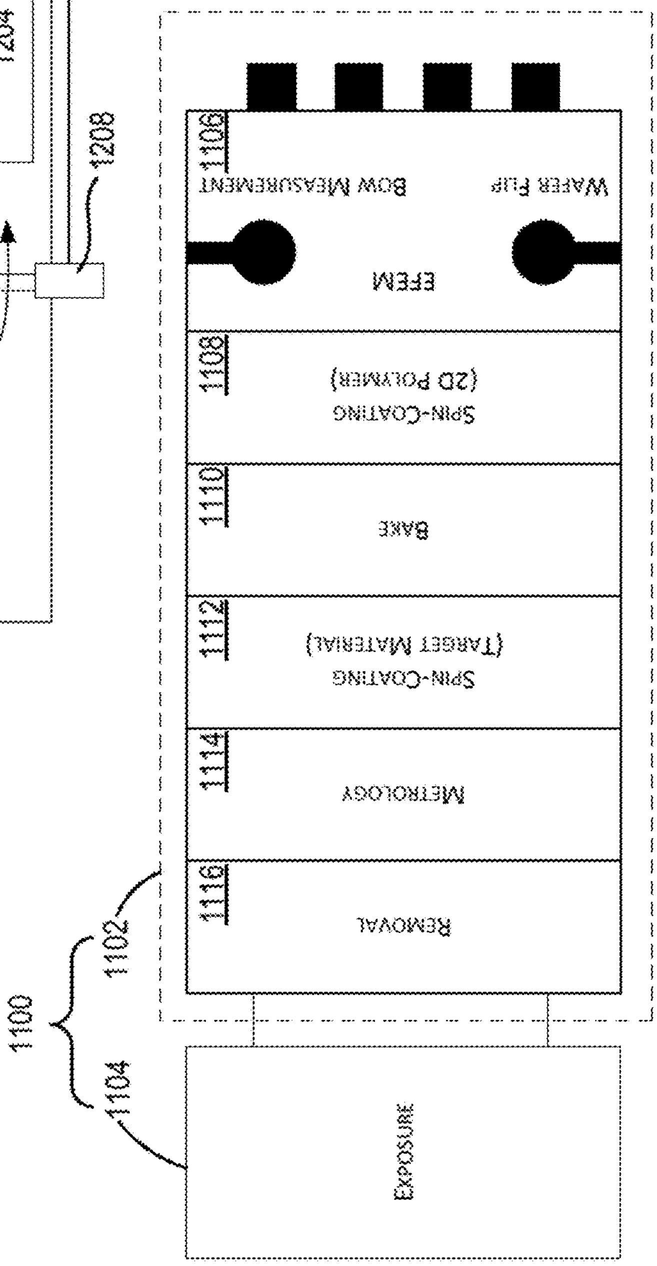
FIG. 11 illustrates a block diagram of an example integrated processing system, according to certain embodiments.

FIGS. 11-12 illustrate example processing tools that may be used, along or in combination, to implement certain embodiments of this disclosure.

FIG. 11 illustrates a block diagram of an example integrated processing system 1100, according to certain embodiments. Integrated processing system 1100 is just one example of a system that may be used with certain embodiments of this disclosure. In the illustrated example, integrated processing system 1100 includes a track system 1102 and an exposure module 1104.

Exposure module 1104 may be configured to perform an exposure phase of a photolithography process. Exposure module 1104 also may be referred to as a projection scanner or a stepper. In certain embodiments, exposure module 1104 is a combination of an optical and mechanical system to scan an optical image of a pattern printed on a photomask onto the surface of a wafer (e.g., semiconductor workpiece 100, 200, 700, 800, 900, 1000) coated with resist. After scanning the pattern once, exposure module 1104 may be operated to step to an adjacent location on the same wafer where the scan is repeated to form another copy of the pattern. In this manner, the photoresist layer is exposed to multiple copies of the pattern arranged in a rectangular matrix on the surface of the wafer.

Track system 1102 includes a series of process modules assembled to allow potentially sequential execution of processes prior to the exposure and after the exposure step performed by exposure module 1104. Track system 1102 provides the material processes such as coating desired surfaces of a wafer with a 2D polymer, depositing a target material over desired surfaces of the wafer, patterning a desired material on the wafer (e.g., patterning a deposited stress film), and the like. In the illustrated example, the process modules of track system 1102 include an equipment front-end (EFEM) module 1106, a spin-coating module 1108 (e.g., for depositing a 2D polymer film), a bake module 1110, a spin-coating module 1112 (for depositing one or more other films), and metrology module 1114, and a removal module 1116 (e.g., for removing the 2D polymer film).

EFEM module 1106 may include a transfer system for moving, flipping, or otherwise physically manipulating a wafer through integrated processing system 1100, and may include measurement capabilities. For example, the EFEM module 1106 may include a transfer system to move a wafer (e.g., a semiconductor workpiece) from module-to-module of track system 1102, as well as from track system 1102 to exposure module 1104 (which may be considered "off track") and from exposure module 1104 back to track system 1102. As another example, EFEM module 1106 may include measurement capabilities for measuring one or more properties of a wafer. As a particular example, EFEM module 1106 may be configured to evaluate an amount of stress on the wafer, such as by measuring an amount of "bowing" in the wafer.

Spin-coating module 1108 may be configured to deposit, by spin-coating, a 2D polymer material over a desired surface of a semiconductor workpiece being processed using integrated processing system 1100. Spin-coating module 1112 may be configured to deposit, by spin-coating, a target material (e.g., a target material being deposited via area selective deposition, a stress film, or any other suitable material) over a desired surface of a semiconductor workpiece being processed using integrated processing system 1100. Spin-coating modules 1108 and 1112 may include spin-coaters, an example of which is described below with reference to FIG. 12. 2D polymer materials, target materials, and solvents may be connected from a liquid supply system to suitable processing modules (e.g., spin-coating modules 1108 and/or 1112 via pipelines, filters, valves, and pumps.

If appropriate, integrated processing system 1100 may include a bake module 1110 for baking a wafer.

Metrology module 1114 may be an optical imaging module used to measure certain features associated with the semiconductor workpiece being processed using integrated processing system 1100. For example, metrology module 1114 may be configured to measure a thickness of a deposited layer. As another example, metrology module 1114 may be configured to evaluate the semiconductor wafer for defects. In certain embodiments, the wafer measurement capabilities (e.g., bow measurement capabilities) of EFEM module 1106 and the measurement capabilities of metrology module 1114 may be combined into a single module.

Metrology module 1114 may image wafers using an imaging system that includes light sources and cameras. The light sources are configured to illuminate the wafer, while the cameras create photographic images of the surfaces. In certain embodiments, the imaging system of metrology module 1114 includes cameras to image the wafer from various directions (e.g., from the top (side coated with photoresist), bottom (backside), and side (beveled edges). The cameras may be coupled to a controller of the imaging system that acquires and transmits the images to an inspection device for image analysis. The inspection device may measure thicknesses and/or identify defects using, for example, a processor of the inspection device configured to execute instructions stored in an electronic memory of the inspection device to perform appropriate image analysis. The quality of the wafer is evaluated by inspecting and measuring various images of the wafer in metrology module 1114.

Metrology module 1114 may include, for example, a scanning electron microscope (SEM) for measuring CDs in the wafer. Wafers may fail inspection because of patterning defects or if the measurements are not within specified limits. Failed wafers may be discarded, or, if possible, reworked by stripping the photoresist and repeating the photoresist patterning process.

Although integrated processing system 1100 is illustrated and described as including particular modules, a particular number of modules, and a particular number of particular types of modules, this disclosure contemplates integrated processing system 1100 including any suitable types and numbers of processing modules in any suitable combination. Integrated processing system 1100 represents just one example system that may be used to process wafers, including to deposit and/or remove layers of 2D polymer material, according to certain embodiments.

FIG. 12 illustrates an example liquid-based spin-on deposition system 1200, according to certain embodiments. For example, liquid-based spin-on deposition system 1200 may be used to process any of the semiconductor workpieces described in this disclosure to deposit any of the 2D polymer layers, target materials, or other suitable layers. In certain embodiments, spin-on deposition system 1200 may be a semi-closed spin-on deposition system used for coating substrates (wafers) with a desired layer. The semi-closed configuration may allow fume control and minimize exhaust volume.

In the illustrated example, spin-on deposition system 1200 includes a process chamber 1202 that includes a substrate holder 1204 for supporting, heating, and rotating (spinning) a substrate 1206 (which may include any of the semiconductor workpieces described in this disclosure at appropriate stages of processing), a rotating apparatus 1208 (e.g., a motor), and a liquid delivery nozzle 1210 configured for providing a processing liquid 1212 to an upper surface of the substrate 1206. Liquid supply systems 1214, 1216 and 1218 supply different processing liquids to the liquid delivery nozzle 1210. For depositing a 2D polymer material, the different processing chemicals can include, for example, the reactants any liquids/gases associated with the reaction conditions. In certain embodiments, spin-on deposition system 1200 includes additional liquid delivery nozzles for providing different liquids to substrate 1206. Example rotating speeds can be between about 500 rpm and about 1500 rpm, for example 1000 rpm, during exposure of an upper surface of substrate 1206 to processing liquid 1212.

Spin-on deposition system 1200 may include a controller 1220 that can be coupled to and control process chamber 1202; liquid supply systems 1214, 1216 and 1218; liquid delivery nozzle 1210; rotating apparatus 1208, mechanism for heating substrate holder 1204. Substrate 1206 may be under an inert atmosphere during film deposition. Spin-on deposition system 1200 may be configured to process substrates 1206 of any suitable size.

Example embodiments of this disclosure are summarized here. Other embodiments can also be understood from the entirety of the specification as well as the claims filed herein.

Example 1. In certain embodiments, a method of microfabrication includes depositing a 2D polymer material over a substrate surface having a first material and a second material such that the 2D polymer adheres to the first material without adhering to the second material. The method further includes depositing a target material over the second material. The 2D material adhered to the first material inhibits deposition of the target material over the first material. The method further includes removing the 2D polymer material.

Example 2. The method of Example 1, where the first material is hydrophilic and second material is hydrophobic.

Example 3. The method of any one of Examples 1-2, further including depositing, prior to depositing the 2D polymer material, a surface modification treatment over the second material, depositing the surface modification treatment increasing a hydrophobicity of the second material.

Example 4. The method of any one of Examples 1-3, where the surface modification treatment comprises a self-assembled monolayer that increases a hydrophobicity of the second material.

Example 5. The method of any one of Examples 1-4, further including cleaning, prior to depositing the target material over the second material, surfaces of the second material using one or more metal-containing chemistries, the one or more metal-containing chemistries comprising one or more of trimethylaluminum (TMA), silanol, alkoxides, metal halides, or organometals.

Example 6. The method of any one of Examples 1-5, where the first material is a first metal and the second material is a second metal.

Example 7. The method of any one of Examples 1-5, where the first material is a first dielectric material and the second material is a second dielectric material.

Example 8. The method of any one of Examples 1-5, where the first material is a dielectric material and the second material is a metal material.

Example 9. The method of any one of Examples 1-5, where the first material is a metal material and the second material is a dielectric material.

Example 10. The method of any one of Examples 1-9, where a deposited thickness of the 2D polymer material is greater than one nanometer.

Example 11. The method of any one of Examples 1-10, where the 2D polymer material is deposited by spin-on deposition.

Example 12. The method of any one of Examples 1-11, where the 2D polymer material is deposited by a vacuum-based deposition process.

Example 13. In certain embodiments, a method of microfabrication includes receiving a semiconductor wafer having a first surface over which structures are to be formed, and having a second surface opposite the first surface. The method further includes depositing a 2D polymer material over the first surface of the semiconductor wafer, positioning the semiconductor wafer over a substrate holder such that the 2D polymer deposited over the first surface is in contact with the substrate holder, and executing subsequent fabrication over a second surface of the semiconductor wafer.

Example 14. The method of Example 13, where the first surface is a frontside surface of the semiconductor wafer having active devices at least partially fabricated.

Example 15. The method of any one of Examples 13-14, where the second surface is a backside surface of the semiconductor wafer, and where executing subsequent fabrication over the second surface of the semiconductor wafer comprises depositing a stress film over the second surface.

Example 16. The method of any one of Examples 13-14, where the first surface is a frontside surface of the semiconductor wafer, the first surface including contacts for one or more frontside metallization layers, and where the second surface is a backside surface of the semiconductor wafer, and where executing subsequent fabrication over the second surface of the semiconductor wafer includes forming a backside power delivery network on the backside of the semiconductor wafer.

Example 17. The method of Example 13, where the first surface is a backside surface of the semiconductor wafer.

Example 18. In certain embodiments, a method of microfabrication includes receiving a semiconductor workpiece that comprises first regions and second regions formed over a semiconductor substrate such that the first regions and second regions are interspersed laterally relative to a surface of the semiconductor substrate. The first regions include a first material, and the second regions include a second material. The method further includes depositing, by spin-on deposition in a first spin-coating module of a track system of an integrated processing system, a 2D polymer material such that the 2D polymer forms a 2D polymer film that is selectively deposited over the surfaces of the first regions relative to surfaces of the second regions. The method further includes depositing, by spin-on deposition in a second spin-coating module of the track system of the integrated processing system, a target material such that the target material is selectively deposited over surfaces of the second regions. The 2D polymer film inhibits deposition of the target material over the surfaces of the first regions. The method further includes removing, using a wet removal process in a removal module of the track system of the integrated processing system, the 2D polymer film.

Example 19. The method of Example 18, where the surfaces of the first regions and the surfaces of the second region have a same wettability property relative to the 2D polymer material, the wettability property repelling deposition of the 2D polymer material, and where the method further includes depositing, prior to depositing the 2D polymer material, a surface modification treatment to the surfaces of the first regions to modify the wettability of the surfaces of the first regions to receive deposition of the 2D polymer material.

Example 20. The method of any one of Examples 18-19, further including functionalizing end groups of the 2D polymer material to repel deposition of the target material.

Example 21. The method of any one of Examples 18-21, where the first spin-coating module and the second spin-coating module are different spin-coating modules of the track system.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

"Substrate," "structure," "semiconductor workpiece," "wafer," "device," or the like, as used herein generically refers to an object being processed in accordance with the disclosure, and may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate, structure, or device is not limited to any particular base structure, underlying layer or overlying layer, patterned or un-patterned, but rather, is contemplated to include any such layer or base structure, and any combination of layers and/or base structures. The description may reference particular types of substrates, structures, or devices, but this is for illustrative purposes only.

Although this disclosure describes particular process steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of microfabrication, the method comprising:

depositing a two-dimensional (2D) polymer material over a substrate surface having a first material and a second material such that the 2D polymer material adheres to the first material without adhering to the second material;

depositing a target material over the second material, the 2D polymer material adhered to the first material inhibiting deposition of the target material over the first material; and removing the 2D polymer material.

2. The method of claim 1, wherein the first material is hydrophilic and the second material is hydrophobic.

3. The method of claim 1, further comprising depositing, prior to depositing the 2D polymer material, a surface modification treatment over the second material, depositing the surface modification treatment increasing a hydrophobicity of the second material.

4. The method of claim 3, wherein the surface modification treatment comprises a self-assembled monolayer that increases a hydrophobicity of the second material.

5. The method of claim 1, further comprising cleaning, prior to depositing the target material over the second material, surfaces of the second material using one or more metal-containing chemistries, the one or more metal-containing chemistries including one or more of trimethylaluminum (TMA), silanol, alkoxides, metal halides, or organometals.

6. The method of claim 1, wherein:

the first material is a first metal and the second material is a second metal; or the first material is a first dielectric material and the second material is a second dielectric material.

7. The method of claim 1, wherein the first material is a dielectric material and the second material is a metal material.

8. The method of claim 1, wherein the first material is a metal material and the second material is a dielectric material.

9. The method of claim 1, wherein a deposited thickness of the 2D polymer material is greater than one nanometer.

10. The method of claim 1, wherein the 2D polymer material is deposited by spin-on deposition.

11. The method of claim 1, wherein the 2D polymer material is deposited by a vacuum-based deposition process.

12. A method of microfabrication, the method comprising:

receiving a semiconductor workpiece that comprises first regions and the second regions formed over a semiconductor substrate such that the first regions and second regions are interspersed laterally relative to a surface of the semiconductor substrate, the first regions comprising a first material and the second regions comprising a second material;

depositing, by spin-on deposition in a first spin-coating module of a track system of an integrated processing system, a two-dimensional (2D) polymer material such that the 2D polymer material forms a 2D polymer film that is selectively deposited over surfaces of the first regions relative to surfaces of the second regions;

depositing, by spin-on deposition in a second spin-coating module of the track system of the integrated processing system, a target material such that the target material is selectively deposited over surfaces of the second regions, the 2D polymer film inhibiting deposition of the target material over the surfaces of the first regions; and removing, using a wet removal process in a removal module of the track system of the integrated processing system, the 2D polymer film.

13. The method of claim 12, wherein:

the surfaces of the first regions and the surfaces of the second regions have a same wettability property relative to the 2D polymer material, the wettability property repelling deposition of the 2D polymer material; and the method further comprises depositing, prior to depositing the 2D polymer material, a surface modification treatment to the surfaces of the first regions to modify the wettability of the surfaces of the first regions to receive deposition of the 2D polymer material.

14. The method of claim 12, further comprising functionalizing end groups of the 2D polymer material to repel deposition of the target material.

15. The method of claim 12, wherein the first spin-coating module and the second spin-coating module are different spin-coating modules of the track system.

* * * * *